(12) United States Patent
Yokoyama et al.

(10) Patent No.: US 12,142,484 B2
(45) Date of Patent: *Nov. 12, 2024

(54) ETCHING METHOD

(71) Applicant: Tokyo Electron Limited, Tokyo (JP)

(72) Inventors: Takahiro Yokoyama, Miyagi (JP); Maju Tomura, Miyagi (JP); Yoshihide Kihara, Miyagi (JP); Ryutaro Suda, Miyagi (JP); Takatoshi Orui, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 4 days.

This patent is subject to a terminal disclaimer.

(21) Appl. No.: 18/113,078

(22) Filed: Feb. 23, 2023

(65) Prior Publication Data

US 2023/0197458 A1   Jun. 22, 2023

Related U.S. Application Data

(60) Division of application No. 17/692,227, filed on Mar. 11, 2022, now Pat. No. 11,615,964, which is a continuation of application No. 17/666,570, filed on Feb. 8, 2022, now Pat. No. 11,551,937, which is a
(Continued)

(30) Foreign Application Priority Data

Nov. 8, 2019 (JP) .................................. 2019-203326
Sep. 11, 2020 (JP) .................................. 2020-152786

(51) Int. Cl.
*H01L 21/3065* (2006.01)
*H01L 21/311* (2006.01)
*H01L 21/3213* (2006.01)

(52) U.S. Cl.
CPC .... *H01L 21/3065* (2013.01); *H01L 21/31116* (2013.01); *H01L 21/32137* (2013.01)

(58) Field of Classification Search
None
See application file for complete search history.

(56) References Cited

U.S. PATENT DOCUMENTS

| 6,635,185 B2 | 10/2003 | Demmin et al. |
| 7,951,683 B1 | 5/2011 | Shanker |
| 8,440,572 B2 | 5/2013 | Honda |
(Continued)

FOREIGN PATENT DOCUMENTS

| JP | 1-103837 A | 4/1989 |
| JP | 7-147273 A | 6/1995 |
(Continued)

OTHER PUBLICATIONS

Korean Request for the Submission of an Opinion issued Nov. 19, 2023, in corresponding Korean Patent Application No. 10-2022-7016762, 9 pages.
(Continued)

*Primary Examiner* — Shamim Ahmed
(74) *Attorney, Agent, or Firm* — XSENSUS LLP

(57) ABSTRACT

An etching method in accordance with the present disclosure includes providing a substrate, which includes a silicon-containing film, in a chamber; and etching the silicon-containing film with a chemical species in plasma generated from a process gas supplied in the chamber. The process gas includes a phosphorus gas component and a fluorine gas component.

20 Claims, 19 Drawing Sheets

Related U.S. Application Data continuation of application No. PCT/JP2020/041026, filed on Nov. 2, 2020.

(56) References Cited

U.S. PATENT DOCUMENTS

| | | |
|---|---|---|
| 10,453,684 B1 | 10/2019 | Zhang et al. |
| 10,741,406 B2 | 8/2020 | Oomori et al. |
| 10,861,693 B2 | 12/2020 | Stone et al. |
| 2002/0096487 A1 | 7/2002 | Demmin et al. |
| 2003/0098288 A1 | 5/2003 | Mori et al. |
| 2006/0073706 A1 | 4/2006 | Li et al. |
| 2010/0093178 A1 | 4/2010 | Honda |
| 2011/0070665 A1 | 3/2011 | Chen et al. |
| 2011/0312180 A1 | 12/2011 | Wang |
| 2013/0323932 A1 | 12/2013 | Guha |
| 2014/0248718 A1 | 9/2014 | Kim et al. |
| 2015/0214474 A1 | 7/2015 | Nishimura et al. |
| 2015/0235862 A1 | 8/2015 | Takahashi et al. |
| 2016/0343580 A1 | 11/2016 | Hudson |
| 2016/0379856 A1 | 12/2016 | Tomura et al. |
| 2017/0103873 A1 | 4/2017 | Kawasaki |
| 2017/0133233 A1 | 5/2017 | Sato et al. |
| 2017/0178894 A1 | 6/2017 | Stone et al. |
| 2017/0222139 A1 | 8/2017 | Nishimura et al. |
| 2017/0330759 A1 | 11/2017 | Gohira et al. |
| 2017/0338119 A1 | 11/2017 | Zhang et al. |
| 2018/0233356 A1 | 8/2018 | Han et al. |
| 2018/0366336 A1 | 12/2018 | Shen et al. |
| 2019/0131140 A1 | 5/2019 | Sun et al. |
| 2019/0185996 A1 | 6/2019 | Jha et al. |

FOREIGN PATENT DOCUMENTS

| | | |
|---|---|---|
| JP | 8-181116 A | 7/1996 |
| JP | 2010-98040 A | 4/2010 |
| JP | 2016-39310 A | 3/2016 |
| JP | 2016-197719 A | 11/2016 |

OTHER PUBLICATIONS

International Search Report and Written Opinion mailed on Feb. 2, 2021, received for PCT Application PCT/JP2020/041026, Filed on Nov. 2, 2020, 8 pages including English Translation.

Notice of Reasons for Refusal mailed on Jul. 13, 2021, received for JP Application 2021-512831, 6 pages including English Translation.

Decision to Grant mailed on Nov. 9, 2021, received for JP Application 2021-512831, 5 pages including English Translation.

US Office Action issued Mar. 3, 2022, in corresponding U.S. Appl. No. 17/090,964.

European Extended Search Report issued Nov. 9, 2023, in corresponding European Patent Application No. 20883813.6, 8 pages.

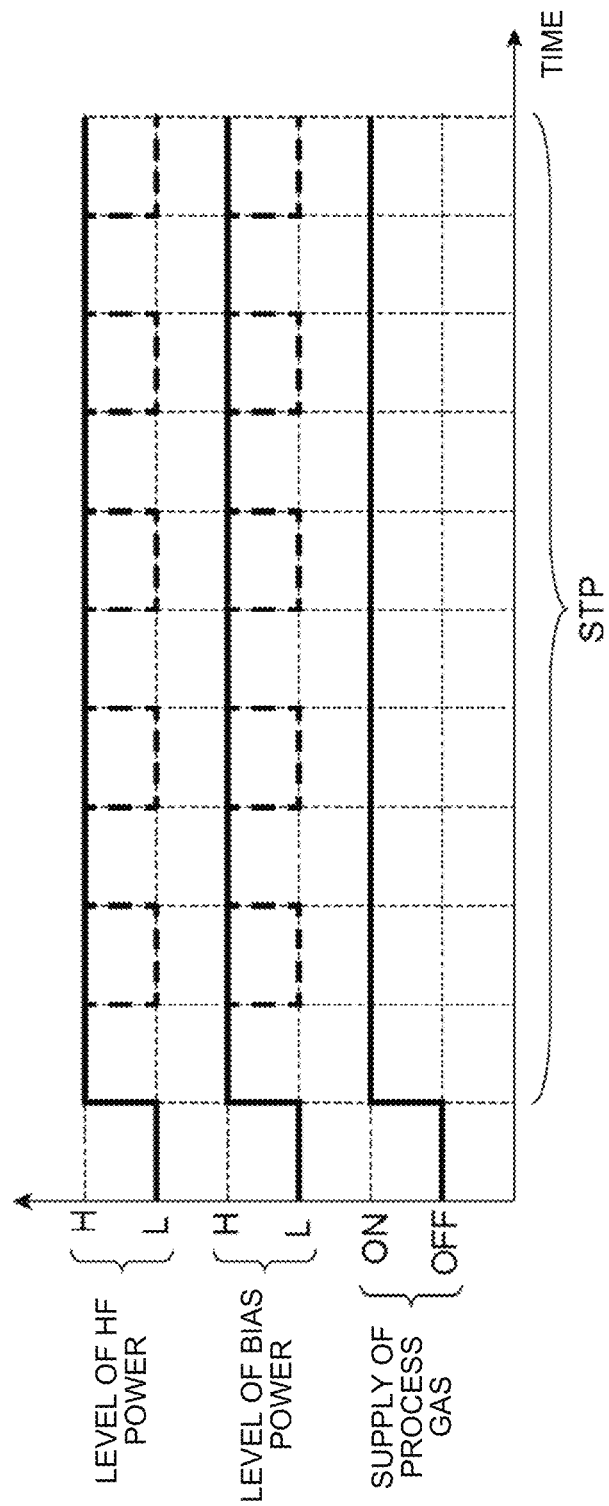

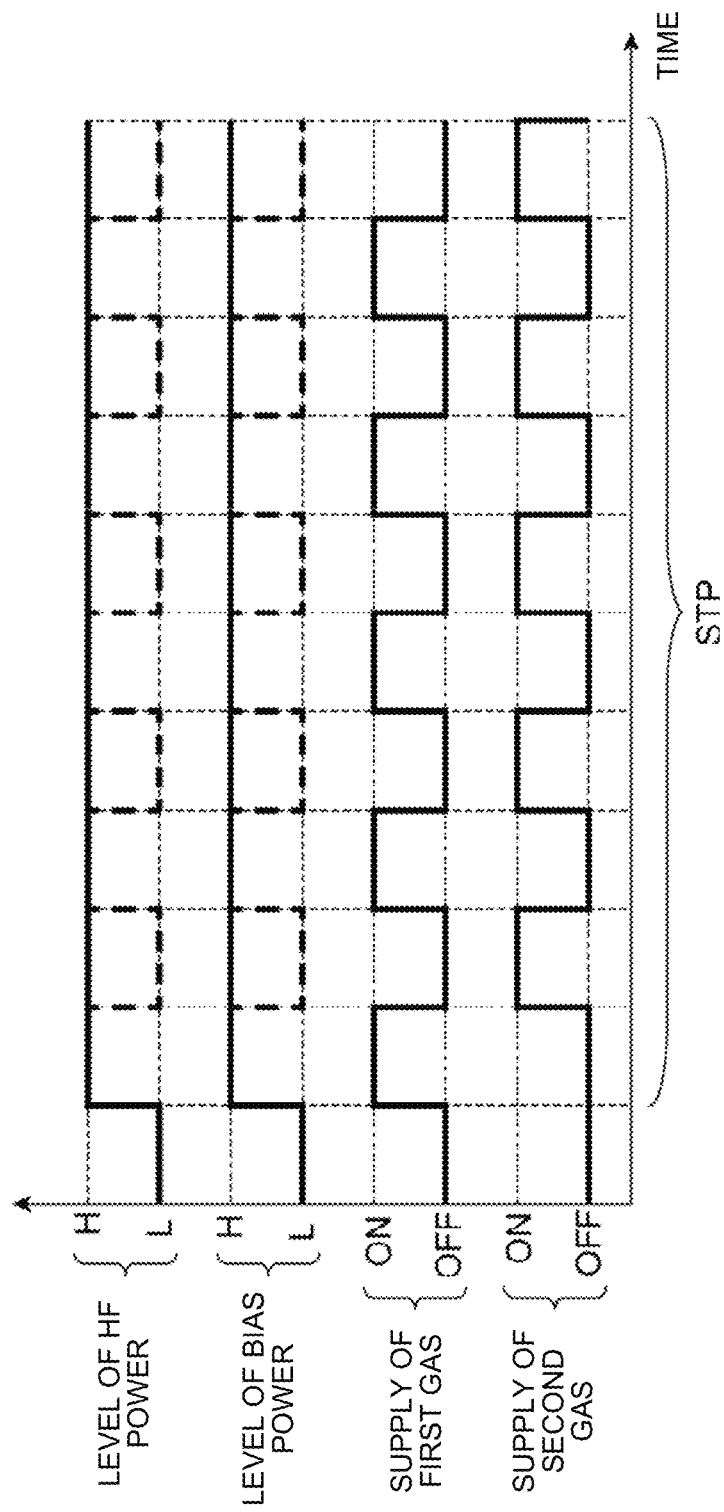

ETCHING METHOD

CROSS-REFERENCE TO RELATED APPLICATIONS

The present application is a divisional of U.S. application Ser. No. 17/692,227, filed on Mar. 11, 2022, which is a continuation application of U.S. application Ser. No. 17/666,570, filed on Feb. 8, 2022 (now U.S. Pat. No. 11,551,937), which is a continuation of and claims priority to PCT/JP2020/041026, filed on Nov. 2, 2020, which is based upon and claims the benefit of the prior Japanese Patent Application No. 2019-203326, filed on Nov. 8, 2019, PCT/JP2020/005847, filed on Feb. 14, 2020, and the prior Japanese Patent Application No. 2020-152786, filed on Sep. 11, 2020, the entire disclosures of each are incorporated herein by reference.

TECHNICAL FIELD

Exemplary embodiments of the present disclosure relate to an etching method, a process gas, and a plasma treatment system.

BACKGROUND

The production of electronic devices involves plasma etching of silicon-containing films on substrates. The plasma etching of the silicon-containing film uses plasma generated from process gases. Conventionally, a process gas may contain a fluorocarbon gas, as a process gas for use in plasma etching of a silicon-containing film. Also conventionally, a process gas may contain a hydrocarbon gas and a hydrofluorocarbon gas, as a process gas for use in plasma etching of a silicon-containing film.

SUMMARY

In an exemplary implementation of the present disclosure, an etching method includes providing a substrate, which includes a silicon-containing film, in a chamber; and etching the silicon-containing film with a chemical species in plasma generated from a process gas supplied in the chamber, wherein the process gas includes a phosphorus gas component and a fluorine gas component.

BRIEF DESCRIPTION OF THE DRAWINGS

FIG. 5 is an exemplary timing chart according to the present disclosure.

FIG. 7 is another exemplary timing chart according to the present disclosure.

DETAILED DESCRIPTION OF THE DRAWINGS

Figure 1:
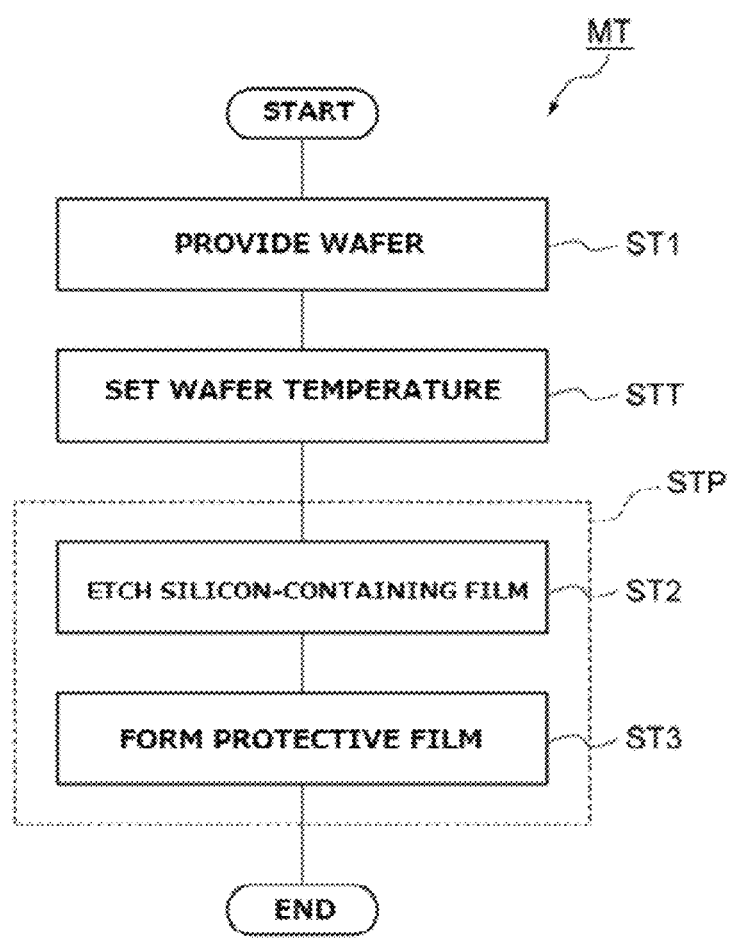
FIG. 1 is a flow chart of an exemplary etching method according to the present disclosure.

The present disclosure provides a technique that enhances the etching rate in a plasma etching process of a silicon-containing film.

Various exemplary embodiments will now be described.

An exemplary embodiment provides an etching method. The method involves a step (a) of providing a substrate in a chamber of a plasma treatment system. The substrate includes a silicon-containing film. The method further involves a step (b) of etching the silicon-containing film with a chemical species in plasma generated from a process gas in the chamber. The process gas includes a phosphorus gas component, a fluorine gas component, and a hydrogen gas component. The hydrogen gas component contains at least one component selected from the group consisting of hydrogen fluoride, $H_2$, ammonia, and hydrocarbons.

According to an exemplary embodiment, the process gas may further include a halogen gas component containing a halogen component other than fluorine component.

Another exemplary embodiment provides an etching method. The method involves a step (a) of providing a substrate in a chamber of a plasma treatment system. The substrate includes a silicon-containing film. The method further involves a step (b) of etching the silicon-containing film with a chemical species in plasma generated from a process gas in the chamber. The process gas includes a phosphorus gas component, a fluorine gas component, a hydrofluorocarbon gas component, and a halogen gas component. The halogen gas component contains a halogen component other than fluorine component.

According to an exemplary embodiment, the fluorine gas component may include at least one gas selected from the group consisting of a fluorocarbon gas and a carbon-free fluorine gas component. The carbon-free fluorine gas component may be nitrogen trifluoride gas or sulfur hexafluoride gas.

According to an exemplary embodiment, the halogen gas component may be $Cl_2$ gas and/or HBr gas.

According to an exemplary embodiment, the ratio of the flow rate of a second gas to the flow rate of a first gas in the process gas may be above 0 and 0.5 or less. The first gas is all the gases included in the process gas excluding a phosphorus gas component. The second gas is a phosphorus-containing gas. The ratio may be 0.075 or more and 0.3 or less.

According to an exemplary embodiment, the method may further involve a step of forming a protective film on the side wall of a recess formed in the step of etching. The protective film contains phosphorus-oxygen bonds contained in the process gas.

According to an exemplary embodiment, the step (b) involves periodically applying pulsed bias electric power to a bottom electrode of a substrate support that supports the substrate, when the plasma is present in the chamber. The bias electric power is radio-frequency bias power or pulsed DC voltage with negative polarity. The frequency defining the period in which pulsed bias electric power is applied to the bottom electrode may be 5 Hz or more and 100 kHz or less.

According to an exemplary embodiment, the method may further involve a step of setting the temperature of the substrate support to 0° C. or less before the step (b).

Yet another exemplary embodiment provides an etching method. The method includes a step of providing a substrate in a chamber of a plasma treatment system. The substrate includes a silicon-containing film and a mask. The method includes a step of generating plasma from a process gas in the chamber to etch the silicon-containing film. The process gas includes a hydrogen fluoride gas component, a phosphorus gas component, and a carbon gas component.

According to an exemplary embodiment, among the flow rate of the hydrogen fluoride gas component, the flow rate of the phosphorus gas component, and the flow rate of the carbon gas component, the flow rate of the hydrogen fluoride gas component may be largest.

According to an exemplary embodiment, the process gas may further include a rare gas. Among the flow rates of all gases in the process gas excluding the rare gas, the flow rate of the hydrogen fluoride gas component may be largest.

According to an exemplary embodiment, in the step (b), the temperature of a substrate support that supports the substrate may be set to a temperature of 0° C. or less or a temperature of −40° C. or less.

According to an exemplary embodiment, the phosphorous-containing gas may contain a halogen component. The halogen component in the phosphorous gas component may be a halogen component other than fluorine component.

According to an exemplary embodiment, the proportion of the flow rate of the phosphorus gas component in the sum of the flow rate of the hydrogen fluoride gas component, the flow rate of the phosphorus gas component, and the flow rate of the carbon gas component may be 2% or more.

According to an exemplary embodiment, the process gas may further include a fluorine-free halogen gas component. The proportion of the flow rate of the halogen gas component in the sum of the flow rate of the hydrogen fluoride gas component, the flow rate of the phosphorus gas component, the flow rate of the carbon gas component, and the flow rate of the halogen gas component may be above 0% and 10% or less.

According to an exemplary embodiment, the silicon-containing film may include a silicon oxide film. The silicon-containing film may further include a silicon nitride film.

Another exemplary embodiment provides a process gas for plasma etching of a silicon oxide film. The process gas includes a hydrogen fluoride gas component, a phosphorus gas component, and a carbon gas component.

According to an exemplary embodiment, among the flow rate of the hydrogen fluoride gas component, the flow rate of the phosphorus gas component, and the flow rate of the carbon gas component, the flow rate of the hydrogen fluoride gas component may be largest.

According to an exemplary embodiment, the process gas may further include a rare gas. Among the flow rates of all the gases in the process gas excluding the rare gas, the flow rate of the hydrogen fluoride gas component may be largest.

According to an exemplary embodiment, the phosphorous gas component may contain a halogen component. The halogen component may be a halogen component other than fluorine component.

According to an exemplary embodiment, the proportion of the flow rate of the phosphorus gas component in the sum of the flow rate of the hydrogen fluoride gas component, and the flow rate of the phosphorous gas component, and the flow rate of the carbon gas component may be 2% or more.

Various exemplary embodiments will now be described in detail in reference to the accompanying drawings. In the drawings, the same reference numeral or symbol is assigned to the same or similar components.

FIG. 1 is a flow chart of an exemplary etching method according to the present disclosure. The etching method (hereinafter, method MT) shown in FIG. 1 is applied to a substrate having a silicon-containing film. The method MT etches the silicon-containing film.

Figure 2:
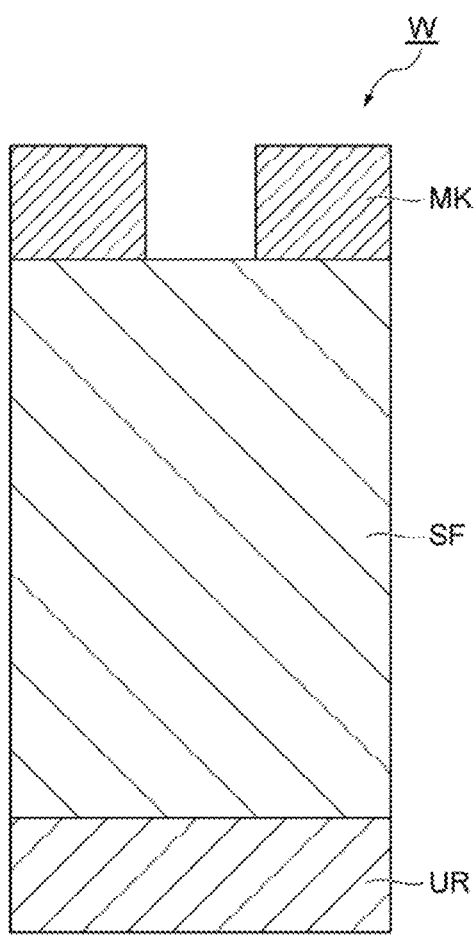
FIG. 2 is a partially enlarged cross-sectional view of an exemplary substrate to which the method shown in FIG. 1 is applied.

FIG. 2 is a partially enlarged cross-sectional view of an exemplary substrate to which the method shown in FIG. 1 can be applied. A substrate W shown in FIG. 2 can be used in production of devices, such as DRAMs and 3D-NANDs. The substrate W has a silicon-containing film SF. The substrate W may further have an underlying region UR. The silicon-containing film SF may be disposed on the underlying region UR.

The silicon-containing film SF may be a silicon-containing dielectric film. The silicon-containing dielectric film may include a silicon oxide film or a silicon nitride film. The silicon-containing dielectric film may be of any other form that contains silicon. The silicon-containing film SF may be a silicon film (for example, a polycrystalline silicon film). The silicon-containing film SF may include at least one of a silicon nitride film, a polycrystalline silicon film, a carbon-containing silicon film, and a low-dielectric-constant film. The carbon-containing silicon film may include a SiC film and/or a SiOC film. The low-dielectric-constant film contains silicon and may be used as an interlayer insulating film. The silicon-containing film SF may include at least two silicon-containing sublayers having different compositions. The at least two silicon-containing sublayers may include a silicon oxide sublayer and a silicon nitride sublayer. The silicon-containing film SF may have a multilayer configuration including alternately stacked one or more silicon oxide sublayers and one or more silicon nitride sublayers. The silicon-containing film SF may have a multilayer configuration including alternately stacked silicon oxide sublayers and silicon nitride sublayers. Alternatively, the at least two silicon-containing sublayers may include a silicon oxide sublayer and a silicon sublayer. The silicon-containing film SF may have a multilayer configuration including, for example, alternately stacked one or more silicon oxide sublayers and one or more silicon sublayers. The silicon-containing film SF may have a multilayer configuration including alternately stacked silicon oxide sublayers and polysilicon sublayers. Alternatively, the at least two silicon-containing films may include a silicon oxide sublayer, a silicon nitride sublayer, and a silicon sublayer.

The substrate W may further include a mask MK. The mask MK is disposed on the silicon-containing film SF. The mask MK is formed with a material having an etching rate that is lower than that of the silicon-containing film SF in Step ST2. The mask MK may be formed with an organic material. In detail, the mask MK may contain carbon. The mask MK may be formed from, for example, an amorphous carbon film, a photoresist film, or a spin-on-carbon film (SOC film). Alternatively, the mask MK may be formed from a silicon-containing film, such as a silicon-containing antireflective film. Alternatively, the mask MK may be a metal-containing mask formed with a metal-containing material, such as titanium nitride, metal tungsten, or tungsten carbide. The mask MK may have a thickness of 3 μm or more.

The mask MK is patterned. In detail, the mask MK has a pattern to be transferred onto the silicon-containing film SF in Step ST2. After the pattern of the mask MK is transferred onto the silicon-containing film SF, the silicon-containing film SF may have a structure such as a recess or trench (recess). The aspect ratio of the structure formed on the silicon-containing film SF in Step ST2 may be 20 or more, 30 or more, 40 or more, or 50 or more. The mask MK may have a line-and-space pattern.

Figure 3:
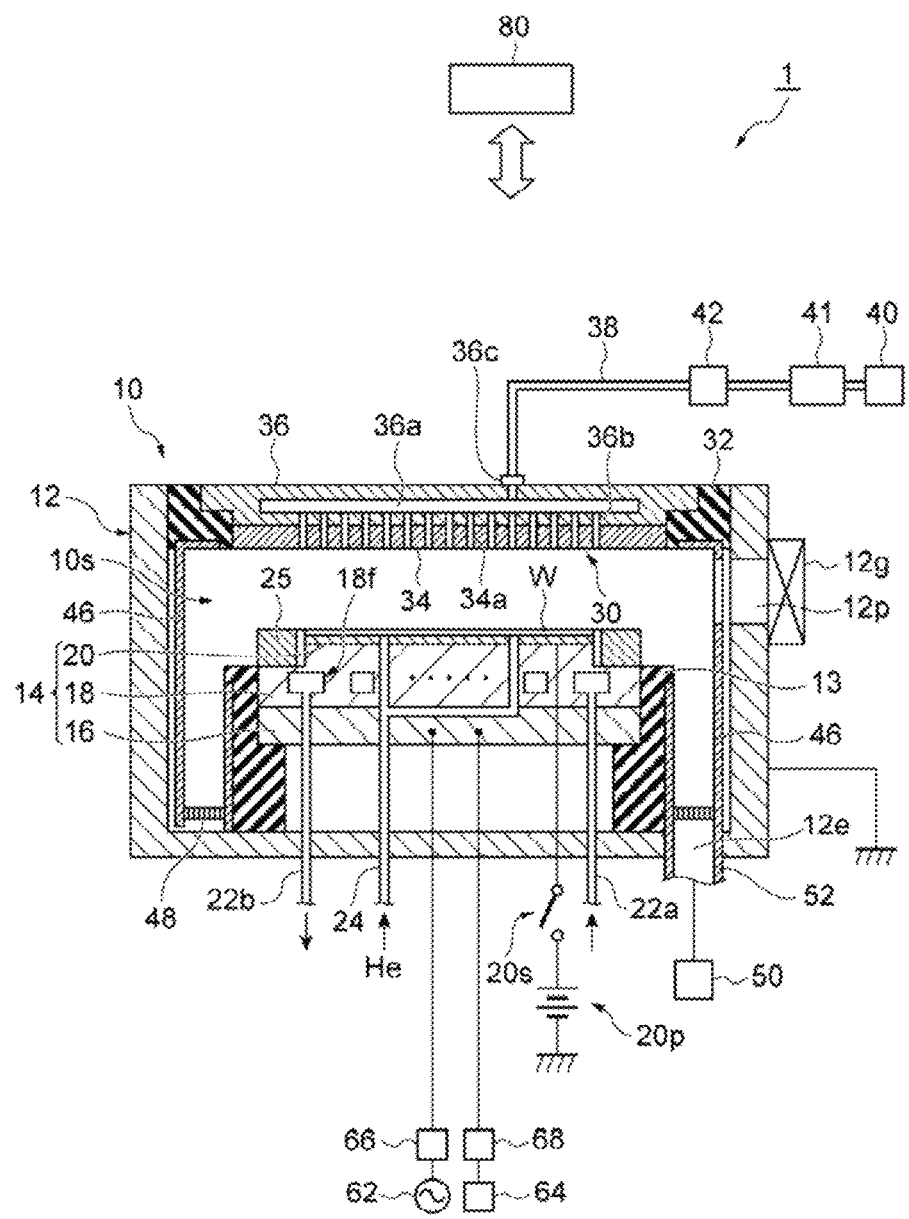
FIG. 3 is a schematic view of a plasma treatment system according to the present disclosure.

In the method MT, a plasma treatment system is used for etching of the silicon-containing film SF. FIG. 3 is a schematic diagram of the plasma treatment system according to the present disclosure. A plasma treatment system 1 shown in FIG. 3 includes a chamber 10 that has an internal space 10s. The chamber 10 includes a chamber body 12 that has a substantially cylindrical shape. The chamber body 12 is composed of, for example, aluminum. The chamber body 12 has an inner wall having an anticorrosive film that may be composed of a ceramic substance, such as aluminum oxide or yttrium oxide.

The side wall of the chamber body 12 has a substrate lane 12p. The substrate W is delivered between the internal space 10s and the exterior of the chamber 10 through the substrate lane 12p. The substrate lane 12p is opened or closed by a gate valve 12g. The gate valve 12g is disposed along a side wall of the chamber body 12.

A support 13 is disposed on the bottom face of the chamber body 12. The support 13 is composed of an insulating material. The support 13 has a substantially cylindrical shape. The support 13 extends vertically from the bottom face of the chamber body 12 in the internal space 10s. The support 13 bears a substrate support 14. The substrate support 14 is configured to support the substrate W in the internal space 10s.

The substrate support 14 includes a lower electrode 18 and an electrostatic chuck 20. The substrate support 14 may further include an electrode plate 16. The electrode plate 16 is composed of a conductor such as aluminum and has a substantially discoid shape. A bottom electrode 18 is disposed on the electrode plate 16. The bottom electrode 18 is composed of a conductor, such as aluminum, and has a substantially discoid shape. The bottom electrode 18 is electrically connected to the electrode plate 16.

The electrostatic chuck 20 is disposed on the lower electrode 18. The substrate W is disposed on the electrostatic chuck 20. The electrostatic chuck 20 has a body and an electrode. The body of the electrostatic chuck 20 has a substantially discoid shape and is composed of a dielectric material. The electrode in the electrostatic chuck 20 is a film-like electrode disposed in the body of the electrostatic chuck 20. The electrode in the electrostatic chuck 20 is connected to a DC power source 20p via a switch 20s. When a voltage from the DC power source 20p is applied to the electrode of the electrostatic chuck 20, an electrostatic attractive force occurs between the electrostatic chuck 20 and the substrate W. The electrostatic chuck 20 attracts the substrate W by the electrostatic attractive force and holds the substrate W thereon.

An edge ring 25 is disposed on the substrate support 14. The edge ring 25 may be composed of silicon, silicon carbide, or quartz. The substrate W is disposed on the electrostatic chuck 20 and is positioned in a region surrounded by the edge ring 25.

The bottom electrode 18 has a flow channel 18f therein. The flow channel 18f is supplied with a heat exchange medium (for example, refrigerant) through piping 22a from a chiller disposed outside the chamber 10. The heat exchange medium supplied to the flow channel 18f returns to the chiller through piping 22b. In the plasma treatment system 1, the temperature of the substrate W on the electrostatic chuck 20 is controlled by heat exchange between the heat exchange medium and the bottom electrode 18.

The plasma treatment system 1 includes a gas supply line 24. The gas supply line 24 supplies a gap between the upper face of the electrostatic chuck 20 and the rear face of the substrate W with a heat-transfer gas (for example, He gas) from a heat-transfer gas supplying mechanism.

The plasma treatment system 1 further include an upper electrode 30. The upper electrode 30 is disposed above the substrate support 14. The upper electrode 30 is supported at the top portion of the chamber body 12 with a fixing member 32. The fixing member 32 is composed of an insulating material. The upper electrode 30 and the fixing member 32 close the upper recess of the chamber body 12.

The upper electrode 30 may include a top plate 34 and a support 36. The lower surface of the top plate 34 faces the internal space 10s and defines the internal space 10s. The top plate 34 may be composed of a conductor or semiconductor that has low resistance to generate less joule heat. The top plate 34 has gas outlet recesses 34a extending through the thickness.

The support 36 detachably supports the top plate 34. The support 36 is composed of a conductive material such as aluminum. The support 36 has an internal gas diffusion space 36a. The support 36 has gas recesses 36b extending downward from the gas diffusion space 36a. These gas recesses 36b are in communication with the respective gas outlet 34a. The support 36 has a gas inlet port 36c. The gas inlet port 36c is connected to the gas diffusion space 36a. The gas inlet port 36c is also connected to a gas feed pipe 38.

A group of gas sources 40 is connected to the gas feed pipe 38 through a group of flow rate controllers 41 and a group of valves 42. The group of flow rate controllers 41 and the group of valves 42 make up a gas supply unit. The gas supply unit may further include a group of gas sources 40. The group of gas sources 40 includes gas sources. The gas sources include process gas sources used in the method MT. The group of flow rate controllers 41 includes flow rate controllers. Each of the flow rate controllers of the group of flow rate controllers 41 is a mass flow controller or a pressure control type flow controller. The group of valves 42 includes open-close valves. Each of the gas sources 40 is connected to the gas feed pipe 38 through the corresponding flow rate controller 41 and the corresponding open-close valve 42. Controller 41 includes, or is controlled by, processing circuitry which will described below with respect to FIG. 19.

In the plasma treatment system 1, a detachable shield 46 is disposed on the face of the inner wall of the chamber body 12 and the periphery of the support 13. The shield 46 can prevent deposition of reaction byproducts in the chamber body 12. The shield 46 is formed, for example, by providing an anticorrosive film on the aluminum base. The anticorrosive film may be composed of a ceramic material, such as yttrium oxide.

A baffle plate 48 is disposed between the support 13 and the side wall of the chamber body 12. The baffle plate 48 is composed of, for example, an aluminum material provided with an anticorrosive film (e.g., yttrium oxide film). The baffle plate 48 has multiple through holes. A gas outlet port 12e is provided below the baffle plate 48 at the bottom of the chamber body 12. The gas outlet port 12e is connected to an evacuation system 50 through a gas outlet pipe 52. The evacuation system 50 includes a pressure regulating valve and a vacuum pump such as a turbo-molecular pump.

The plasma treatment system 1 includes a radio-frequency power source 62 and a bias power source 64. The radio-frequency power source 62 generates radio-frequency power HF. The radio-frequency power HF has a first frequency suitable for generation of plasma. The first frequency ranges, for example, from 27 MHz to 100 MHz. The radio-frequency power source 62 is coupled to the bottom electrode 18 via a matching unit 66 and the electrode plate 16. The matching unit 66 has a circuit for matching of the output impedance of the radio-frequency power source 62 and the impedance at the load (at the bottom electrode 18) of the radio-frequency power source 62. It should be noted that the radio-frequency power source 62 may be coupled to the upper electrode 30 via the matching unit 66. The radio-frequency power source 62 functions as a part of an exemplary plasma generator.

The bias power source 64 generates bias electric power. The bias power source 64 is electrically coupled to the bottom electrode 18. The bias electric power has a second frequency that is lower than the first frequency. For example, the second frequency ranges from 400 kHz to 13.56 MHz. In the case where bias electric power is used with radio-frequency power HF, the bias electric power is applied to the substrate support 14 (in an example, the bottom electrode 18) so that ions are attracted to the substrate W. Upon application of the bias electric power to the bottom electrode 18, the potential of the substrate W disposed on the substrate support 14 varies in response to each period of the second frequency.

In one embodiment, the bias electric power may be radio-frequency power LF having a second frequency. In the case where the radio-frequency power LF is used with the radio-frequency power HF, the radio-frequency power LF is used as radio-frequency bias power that allows the substrate W to attract ions. The bias power source 64, which generate radio-frequency power LF, is coupled to the bottom electrode 18 via a matching unit 68 and the electrode plate 16. The matching unit 68 has a circuit for matching of the output impedance of the bias power source 64 and the impedance at the load (at the bottom electrode 18) of the bias power source 64.

The plasma may be generated using only the radio-frequency power LF without use of the radio-frequency power HF, in other words, using single radio-frequency power. In such a case, the radio-frequency power LF may have a frequency higher than 13.56 MHz, for example, 40 MHz. In such a case, the plasma treatment system 1 may not require the radio-frequency power source 62 or the matching unit 66. In such a case, the bias power source 64 makes up an exemplary plasma generator.

In another embodiment, the bias electric power may be pulsed DC voltage. The pulsed DC voltage is periodically generated and applied to the bottom electrode 18. The period of the pulsed DC voltage is defined by the second frequency. The period of the pulsed DC voltage includes two terms. The DC voltage in at least one of the two terms is a DC voltage with negative polarity. The level (or absolute value) of the DC voltage at one of the two terms is higher than the level (or absolute value) of the DC voltage at the other term. The DC voltage at the other term may have either negative polarity or positive polarity. The level of the DC voltage with negative polarity at the other term may be higher than zero or be zero. In this embodiment, the bias power source 64 is connected to the bottom electrode 18 via a low-pass filter and the electrode plate 16. The pulse waves used as bias electric power may include a pulsed voltage having a waveform different from a direct-current waveform.

In one embodiment, the bias power source 64 may apply continuous waves of the bias electric power to the bottom electrode 18. In detail, the bias power source 64 may continuously apply bias electric power to the bottom electrode 18. The continuous waves of the bias electric power may be applied to the bottom electrode 18 during Step STP, i.e., Steps ST2 and ST3 in the method MT.

In another embodiment, the bias power source 64 may apply pulsed bias electric power to the bottom electrode 18. The pulsed bias electric power may be periodically applied to the bottom electrode 18. The period of the pulsed bias electric power is defined by a third frequency. The third frequency is lower than the second frequency. The third frequency is, for example, 1 Hz or more and 200 kHz or less. In another example, the third frequency may be 5 Hz or more and 100 kHz or less.

The period of the pulsed waves of the bias electric power includes two terms, i.e., a term H and a term L. The level of the bias electric power (or the level of pulses of the bias electric power) at the term H is higher than the level of the bias electric power at the term L. A variation in level of the bias electric power allows the pulsed bias electric power to be applied to the bottom electrode 18. The level of the bias electric power at the term L may be higher than zero. Alternatively, the level of the bias electric power at the term L may be zero. In summary, supply of the pulsed bias electric power to be applied to the bottom electrode 18 is alternately switched between continuation and cessation. If the bias electric power is radio-frequency power LF, the level of the bias electric power is the level of the radio-frequency power LF. If the bias electric power is radio-frequency power LF, the level of the radio-frequency power LF in the pulsed bias electric power may be 2 kW or more. If the bias electric power is pulsed DC voltage with negative polarity, the effective level of the bias electric power corresponds to the absolute DC voltage with a negative polarity.

The duty ratio of the pulsed bias electric power, in detail, the rate of the term H to the period of the pulsed bias electric power is, for example, 1% or more and 80% or less. In another example, the duty ratio of the pulsed bias electric power may be 5% or more and 50% or less. Alternatively, the duty ratio of the pulsed bias electric power may be 50% or more and 99% or less. The pulsed bias electric power may be applied to the bottom electrode 18 in Steps ST2 and ST3 in the method MT.

In one embodiment, the radio-frequency power source 62 may supply continuous waves of the radio-frequency power HF. In other words, the radio-frequency power source 62 may continuously supply the radio-frequency power HF. The continuous waves of the radio-frequency power HF can be supplied during Step STP, i.e., Steps ST2 and Step ST3 in the method MT.

In another embodiment, the radio-frequency power source 62 may supply the pulsed waves of the radio-frequency power HF. The pulsed waves of the radio-frequency power HF can be periodically supplied. The pulsed radio-frequency power HF is defined by a fourth frequency. The fourth frequency is lower than the second frequency. In one embodiment, the fourth frequency equals the third frequency. The period of the pulsed waves of the radio-frequency power HF includes two terms, a term H and a term L. The level of the radio-frequency power HF at the term H is higher than the level of the radio-frequency power HF at the term L of the two terms. The level of the radio-frequency power HF at the term L may be higher than zero or be zero.

The period of the pulsed radio-frequency power HF may be in synchronization with the period of the pulsed bias electric power. In detail, the term H in the period of the pulsed radio-frequency power HF may be in synchronization with the term H in the period of the pulsed bias electric power. Alternatively, the term H in the period of the pulsed radio-frequency power HF may not be in synchronization with the term H in the period of the pulsed bias electric power. The length of the term H in the period of the pulsed radio-frequency power HF may be the same as or different from the length of the term H in the period of the pulsed bias electric power.

At the start of the plasma treatment in the plasma treatment system 1, gas is supplied from the gas supply unit to the internal space 10s. The radio-frequency power HF and/or bias electric power is also supplied to generate a radio-frequency electric field between the upper electrode 30 and the bottom electrode 18. The radio-frequency electric field generates plasma from the gas in the internal space 10s.

The plasma treatment system 1 further includes a controller 80. The controller 80 may be a computer provided with, for example, a processor, a storage such as a memory, an input system, a display, and a signal I/O interface. The controller 80 controls individual components of the plasma treatment system 1. The controller 80 allows an operator to input any command for controlling the plasma treatment system 1 through an input device. The controller 80 allows a display to present the operational state of the plasma treatment system 1 visually. The storage stores control programs and recipe data. The processor executes the control programs to execute various processes with the plasma treatment system 1, and controls individual components in the plasma treatment system 1 in accordance with recipe data. A structural configuration of controller 80 is described below with respect to FIG. 19.

Referring again to FIG. 1, the substrate W shown in FIG. 2 is treated in the plasma treatment system 1 in accordance with the method MT. The method MT is carried out through control of individual components by the controller 80 in the plasma treatment system 1. The following description also includes the control of individual components in the plasma treatment system 1 by the controller 80 in the method MT.

Figure 4A:
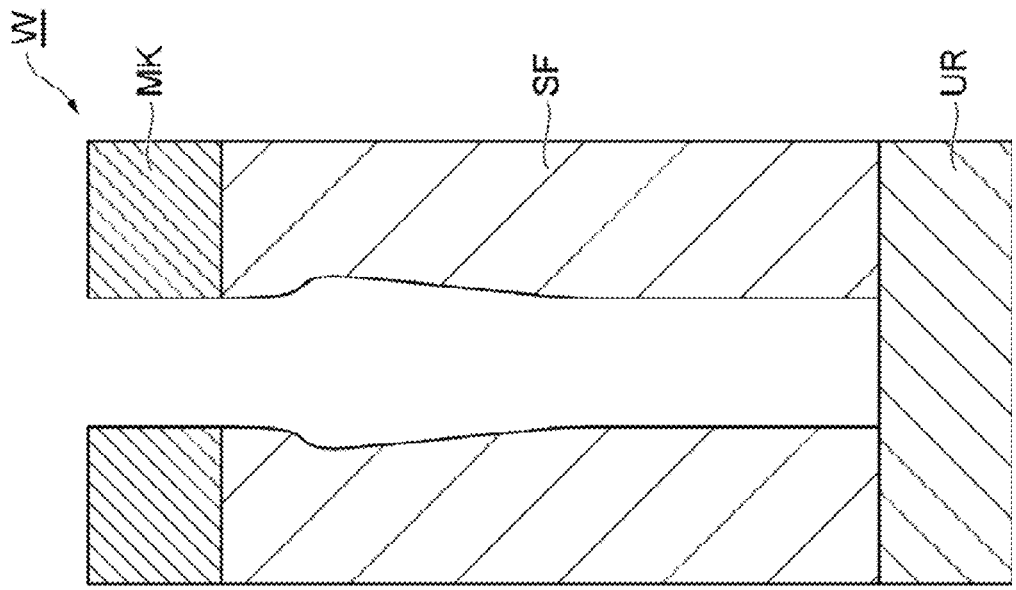
FIG. 4A is a partially enlarged cross-sectional view of an exemplary substrate to which the method in FIG. 1 is applied.
Figure 4B:
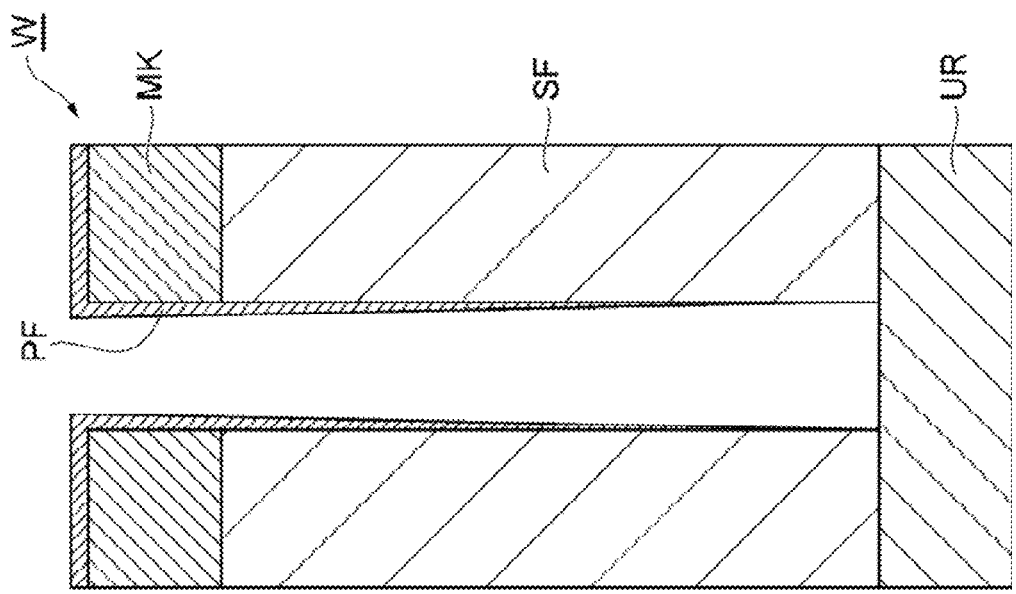
FIG. 4B is a partially enlarged cross-sectional view of an exemplary substrate that is etched in plasma generated from a phosphorus-free process gas.

The following description is carried out with reference to FIGS. 1, 4A, 4B, and 5. FIG. 4A is a partially enlarged cross-sectional view of an exemplary substrate to which the method shown in FIG. 1 is applied; and FIG. 4B is a partially enlarged cross-sectional view of an exemplary substrate that is etched in plasma generated from a phosphorus-free process gas. FIG. 5 is an exemplary timing chart in the method according to an exemplary embodiment where the horizontal axis indicates time while the vertical axis indicates the level of the radio-frequency power HF, the level of the bias electric power, and the supply of the process gas. The level "L" in the radio-frequency power HF indicates that no radio-frequency power HF is supplied or the level of the radio-frequency power HF is lower than the level "H". The level "L" in the bias electric power indicates that no bias electric power is applied to the bottom electrode 18 or the level of the bias electric power is lower than the level "H". The symbol "ON" in the supply of the process gas indicates that the process gas is being supplied into the chamber 10 whereas the symbol "OFF" indicates that the process gas is not being supplied into the chamber 10.

With reference to FIG. 1, the method MT starts with Step ST1. The substrate W is disposed in the chamber 10 in Step ST1. The substrate W is held on the electrostatic chuck 20 in the chamber 10. The substrate W may have a diameter of 300 mm.

Step STP is then performed in the method MT. Step STP involves a plasma treatment of the substrate W. Plasma is generated from the process gas in the chamber 10 in Step STP. The method MT includes Step ST2. Step ST2 is carried out in Step STP. The method MT may further include Step ST3. Step ST3 may be carried out in Step STP. Step ST2 and Step ST3 may be carried out at the same time or independently.

In Step ST2, the silicon-containing film SF is etched by a chemical species in plasma generated from the process gas in the chamber 10 in Step STP. In Step ST3, a protective film PF is formed on the substrate W by the chemical species generated from the process gas in the chamber 10 in Step STP. The protective film PF is formed on the side wall of a recess formed in the silicon-containing film SF.

The process gas used in Step STP contains a halogen gas component and a phosphorus gas component. The halogen gas component contained in the process gas may be a fluorine gas component. The process gas may contain at least one halogen-containing molecule. The at least one halogen-containing molecule in the process gas may be fluorocarbon or hydrofluorocarbon. Examples of the fluorocarbon include $CF_4$, $C_3F_8$, $C_4F_6$, and $C_4F_8$. Examples of the hydrofluorocarbon include $CH_2F_2$, $CHF_3$, and $CH_3F$. The hydrofluorocarbon may include two or more carbon atoms. The hydrofluorocarbon may include, for example, three carbon atoms or four carbon atoms.

The process gas may contain at least one molecule containing the phosphorous component. The molecules containing the phosphorous component may be phosphorus oxides, such as tetraphosphorus decaoxide ($P_4O_{10}$), tetraphosphorus octoxide ($P_4O_8$), and tetraphosphorus hexaoxide ($P_4O_6$). Tetraphosphorus decaoxide is also called diphosphorus pentoxide ($P_2O_5$). The molecules containing the phosphorous component may be phosphorus halides, such as phosphorus trifluoride ($PF_3$), phosphorus pentafluoride ($PF_5$), phosphorus trichloride ($PCl_3$), phosphorus pentachloride ($PCl_5$), phosphorous tribromide ($PBr_3$), phosphorus pentabromide ($PBr_5$), and phosphorus triiodide ($PI_3$). In other words, the molecules containing the phosphorous component may contain fluorine component as a halogen component. Alternatively, the molecules containing the phosphorous component may contain a halogen component other than fluorine component, as a halogen component. The molecules containing the phosphorous component may be phosphoryl halides, such as phosphoryl fluoride ($POF_3$), phosphorus oxychloride ($POCl_3$), and phosphoryl bromide ($POBr_3$). The molecules containing the phosphorous component may be phosphine ($PH_3$), calcium phosphide ($Ca_3P_2$), phosphoric acid ($H_3PO_4$), sodium phosphate ($Na_3PO_4$), and hexafluorophosphoric acid ($HPF_6$). The molecules containing the phosphorous component may be fluorophosphines ($H_xPF_y$), where the sum of x and y is three or five. Examples of the fluorophosphines include $HPF_2$ and $H_2PF_3$. The at least one phosphorus component in the process gas may be at least one of these molecules containing the phosphorous component. For example, the process gas may contain at least one molecule containing the phosphorous component selected from the group consisting of $PF_3$, $PCl_3$, $PF_5$, $PCl_5$, $POCl_3$, $PH_3$, $PBr_3$, and $PBr_5$. A solid or liquid molecule containing the phosphorous component may be heated to vaporization and then introduced in the chamber 10.

The process gas used in Step STP may further contain a carbon component and a hydrogen component. Examples of the process gas include $H_2$, hydrogen fluoride (HF), hydrocarbons ($C_xH_y$), hydrofluorocarbons ($CH_xF_y$), and $NH_3$ as the molecule containing the hydrogen component, where x and y are each a natural number. These gases may be used alone or in combination. Examples of the hydrocarbon includes $CH_4$ and $C_3H_6$. Examples of the carbon component in the process gas include fluorocarbons and hydrocarbons (for example, $CH_4$). The process gas may further contain an oxygen component. For example, the process gas may contain $O_2$. Alternatively, the process gas may be free of oxygen.

The process gas used in Step STP may contain a hydrogen fluoride gas component and a phosphorus gas component.

In one embodiment, the process gas includes a phosphorus gas component, a fluorine gas component, and a hydrogen gas component. The hydrogen gas component contains at least one component selected from the group consisting of hydrogen fluoride (HF), $H_2$, ammonia ($NH_3$), and hydrocarbons. The phosphorus gas component includes at least one of the phosphorous compounds listed above. The fluorine gas component includes at least one component selected from the group consisting of a fluorocarbon gas and a carbon-free fluorine gas component. The fluorocarbon gas component is a gas containing the fluorocarbon component listed above. The carbon-free fluorine gas component is, for example, nitrogen trifluoride gas ($NF_3$ gas) or sulfur hexafluoride gas ($SF_6$ gas). The process gas may further include a hydrofluorocarbon gas component. The hydrofluorocarbon gas component is gas of the hydrofluorocarbons listed above. The process gas may further include a halogen gas component containing a halogen component other than fluorine component. The halogen gas component is, for example, $Cl_2$ gas and/or HBr gas.

An exemplary process gas includes a phosphorus gas component, a fluorocarbon gas component, a hydrogen gas component, and an oxygen gas component (for example, $O_2$ gas), or is substantially composed of these gases. Another exemplary process gas includes a phosphorus gas component, a carbon-free fluorine gas component, a fluorocarbon gas component, a hydrogen gas component, a hydrofluorocarbon gas component, and a halogen gas component containing a halogen component other than fluorine component, or is substantially composed of these gases.

In another embodiment, the process gas includes the phosphorus gas component described above, the fluorine gas component described above, the hydrofluorocarbon gas component described above, and the halogen gas component containing a halogen component other than fluorine component described above, or is substantially composed of these gases.

In one embodiment, the process gas may contain a first gas and a second gas. The first gas does not contain phosphorus component. In other words, the first gas is all the gases excluding the phosphorus gas component in the process gas. The first gas may contain a halogen component. The first gas may contain gas of at least one of the halogen-containing molecules described above. The first gas may further contain a carbon component and a hydrogen component. The first gas may further contain gas of a hydrogen-containing compound and/or gas of a carbon-containing compound. The first gas may further contain an oxygen component. The first gas may contain $O_2$ gas. Alternatively, the first gas may be free of oxygen. The second gas is a gas containing phosphorus component. Specifically, the second gas is the phosphorus gas component described above. The second gas may contain gas of the at least one of the phosphorus compounds described above.

In the process gas used in Step STP, the ratio of the flow rate of the second gas to the flow rate of the first gas may be above 0 and 0.5 or less. The ratio may be 0.075 or more and 0.3 or less. The ratio may be 0.1 or more and 0.25 or less.

With reference to FIG. 5, the process gas is supplied to the chamber 10 in Step STP. In Step STP, the gas pressure in the chamber 10 is adjusted to a predetermined value. In Step STP, the gas pressure in the chamber 10 may be adjusted to 5 mTorr (0.65 Pa) or more and 100 mTorr (13.3 Pa) or less. In Step STP, a radio-frequency power HF is supplied to form plasma from the process gas in the chamber 10. As depicted with a solid line in FIG. 5, a continuous wave of radio-frequency power HF may be applied in Step STP. In Step STP, the radio-frequency power HF may be replaced with the radio-frequency power LF. In Step STP, both the radio-frequency power HF and the bias electric power may be supplied. As shown by the solid line in FIG. 5, a continuous wave of bias electric power may be applied to the bottom electrode 18 in Step STP. The level of the radio-frequency power HF may be adjusted to 2 kW or more and 10 kW or less. If the radio-frequency power LF is used as the bias electric power, the level of the radio-frequency power LF may be adjusted to 2 kW or more. The level of the radio-frequency power LF may be adjusted to 10 kW or more.

In Step STP, the controller 80 controls the gas supply unit to supply the process gas into the chamber 10. The controller 80 also controls the evacuation system 50 such that the gas pressure in the chamber 10 is regulated within a predetermined pressure. In addition, the controller 80 controls the radio-frequency power source 62 and the bias power source 64 to supply the radio-frequency power HF, radio-frequency power LF, or the radio-frequency power HF and the bias electric power.

In Step ST2, the controller 80 controls the gas supply unit to supply the process gas into the chamber 10. The controller 80 also controls the evacuation system 50 to keep the gas pressure in the chamber 10 at a predetermined value. In addition, the controller 80 controls the radio-frequency power source 62 and the bias power source 64 to supply the radio-frequency power HF, radio-frequency power LF, or the radio-frequency power HF and the bias electric power.

In an embodiment of the method MT, the substrate W may be kept at a temperature of 0° C. or less at the start of Step ST2 (or Step STP). At such a temperature, the etching rate of the silicon-containing film SF on the substrate W increases in Step ST2. The controller 80 may control a chiller to adjust the temperature of the substrate W at the start of Step ST2. In Step ST2 (or Step STP), the temperature of the substrate W may be 200° C. or less. A temperature of 200° C. or less of the substrate W in Step ST2 (or Step STP) ensures supply of an etchant, i.e., phosphorus chemical species into the bottom of the recesses formed in the silicon-containing film SF.

According to the Arrhenius equation that defines reaction rate increase with temperature, the amount of side etching decreases at low temperatures (for example, 0° C. or lower). At low temperatures, the volatility (which is a measure indicating how a material vaporizes) of the protective film (P—O) decreases. As described above, because of low volatility (chemically strong), the protective film preventing the side wall from being laterally etched is more effective at low temperatures. In addition, the high-aspect ratio etching tends to increase ion energy. The inventor of the present disclosure recognizes the benefit of the etching temperature that should be low in order to enhance the effectiveness of the protective film. In the present disclosure, therefore, the protective film having a low volatility (which is achieved by controlling the temperature of the substrate W to a low temperature) is more desirable because it helps to reduce etching of the side wall (bowing).

In one embodiment, the method MT may further involve Step STT. Step STT may be executed prior to Step ST2 (or Step STP). The temperature of the substrate W is set to 0° C. or less in Step STT. The temperature of the substrate W at the start of Step ST2 is set in Step STT. The controller 80 may control the chiller to set the temperature of the substrate W in Step STT.

In Step ST2, the silicon-containing film SF is etched by halogen chemical species in the plasma generated from the process gas. In one embodiment, the unmasked portion (portion exposed to plasma) of the silicon-containing film SF is etched as shown in FIG. 4A.

If the process gas contains a compound functioning as a phosphorus component and a halogen component, such as $PF_3$, the halogen chemical species derived from the compound contributes to etching of the silicon-containing film SF. The compound containing phosphorus component and halogen component, such as $PF_3$, can accordingly enhance the etching rate of the silicon-containing film SF in Step ST2.

In Step ST3, a protective film PF is formed on the side wall of the recess formed by etching in Step ST2 in the silicon-containing film SF (refer to FIG. 4A). The protective film PF is formed from the chemical species included in the plasma generated from the process gas in the chamber 10 in Step STP. Step ST3 and Step ST2 may be carried out at the same time. Referring to FIG. 4A, the protective film PF according to one embodiment is formed such that its thickness decreases toward the depth of the recess formed in the silicon-containing film SF.

The protective film PF contains silicon and phosphorus component contained in the process gas used in Step STP. In one embodiment, the protective film PF may further contain carbon and/or hydrogen contained in the process gas. In one embodiment, the protective film PF may further contain oxygen contained in the process gas or the silicon-containing film SF. In one embodiment, the protective film PF may contain bonds between phosphorus and oxygen.

Figure 6A:
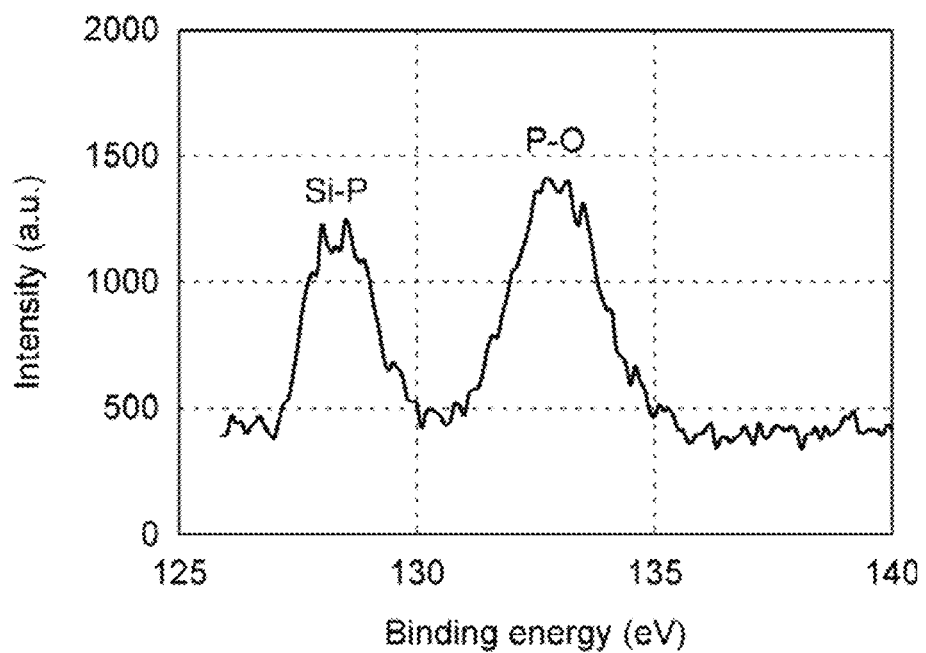
FIGS. 6A and 6B illustrate results of X-ray Photoelectron Spectroscopy (XPS) analysis of a protective film PF formed in an experimental example involving etching of a silicon oxide film and a silicon nitride film, respectively, in Step STP of the etching method in FIG. 1.
Figure 6B:
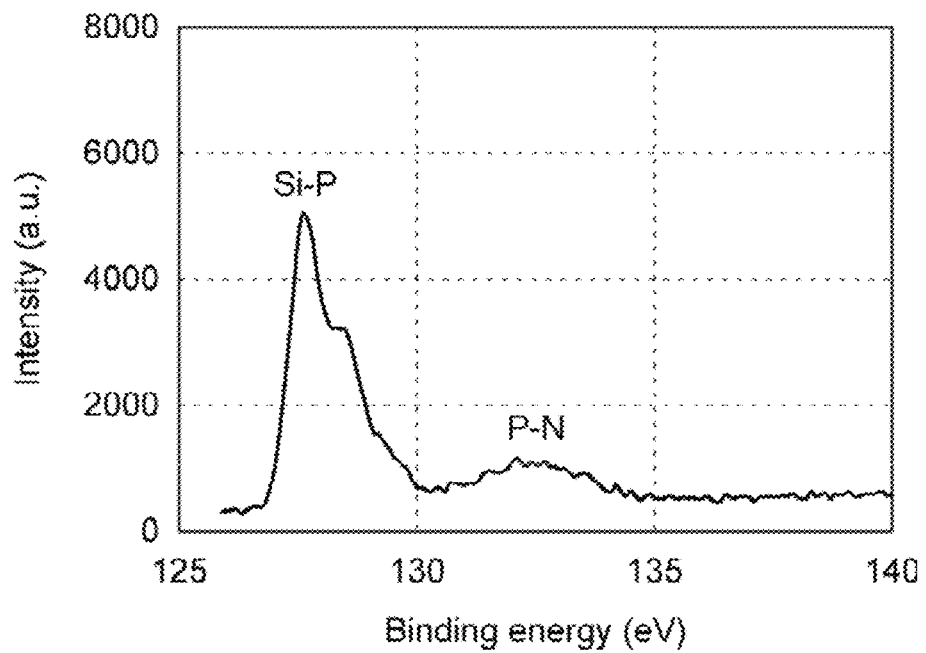

FIGS. 6A and 6B illustrate the results of XPS analysis of protective films PF formed in an experimental example that involves etching of a silicon oxide film and a silicon nitride film, respectively, in Step STP. FIGS. 6A and 6B illustrate P2p spectra. The conditions of the experimental example in Step STP are as follows:

<Conditions in Step STP>
Gas pressure in chamber 10: 100 mTorr (13.33 Pa)
Process gas: 50 sccm of $PF_3$ gas and 150 sccm of Ar gas
Radio-frequency power HF (continuous wave): 40 MHz, 4500 W
Radio-frequency power LF (continuous wave): 400 kHz, 7000 W
Substrate temperature (temperature of substrate support before etching): −70° C.
Execution time in Step STP: 30 seconds According to the experimental results of the etching of the silicon oxide film in Step STP, the results of the XPS analysis of the protective film PF show a peak assigned to a Si—O bond and a peak assigned to a P—O bond as illustrated in FIG. 6A. According to the experimental results of the etching of the silicon nitride film in Step STP, the results of the XPS analysis of the protective film PF show a peak assigned to a Si—P bond and a peak assigned to a P—N bond as illustrated in FIG. 6B.

In one embodiment, the plasma of the process gas described above contains a plasma generated from hydrogen fluoride component. In one embodiment, the largest amount of chemical species included in the plasma generated from the process gas may be hydrogen fluoride component. In the presence of the phosphorous chemical species generated from the phosphorus gas component (the gas containing the phosphorous compound described above) on a surface of the substrate W, adsorption of hydrogen fluoride component, that is, etchant to the substrate W is promoted. More specifically, in the presence of the phosphorous chemical species generated from the phosphorus gas component on a surface of the substrate W, supply of the etchant to the bottom of the hole (recess) is promoted and the etching rate of the silicon-containing film SF is thereby enhanced.

If the process gas does not contain phosphorus component, the silicon-containing film SF is etched also in the lateral direction as shown in FIG. 4B. As a result, the width of the recess formed in the silicon-containing film SF increases partly. For example, the width of the recess formed in the silicon-containing film SF increases partly in the vicinity of the mask MK.

In the method MT, the protective film PF is formed on the side wall of the recess formed in the silicon-containing film SF during the etching. The protective film PF protects the side wall and allows the silicon-containing film SF to be etched at the same time. Lateral etching is accordingly reduced during the plasma etching of the silicon-containing film SF in the method MT.

In one embodiment, one or more periods of Steps ST2 and ST3 may be executed while Step STP is being continued, in detail, while plasma is generated from the process gas in Step STP. Step STP may involve at least two periods.

In one embodiment, the pulsed bias electric power may be applied from the bias power source 64 to the bottom electrode 18 in Step STP, as depicted with broken lines in FIG. 5. In detail, the pulsed bias electric power may be applied from the bias power source 64 to the bottom electrode 18, in the presence of plasma generated from the process gas in the chamber 10. In this embodiment, the silicon-containing film SF is etched mainly within the term H in the period of the pulsed bias electric power in Step ST2. The protective film PF is formed mainly within the term L in the period of the pulsed bias electric power in Step ST3.

If the bias electric power is radio-frequency power LF, the radio-frequency power LF may be adjusted to 2 kW or more during the term H of the period of pulsed bias electric power. Alternatively, the radio-frequency power LF may be adjusted to 10 kW or more during the term H of the period of pulsed bias electric power.

In one embodiment, the pulsed waves of the radio-frequency power HF may be applied in Step STP, as depicted with broken lines in FIG. 5. The radio-frequency power HF may be adjusted to 1 kW or more and 10 kW or less within the term H in the period of the pulsed radio-frequency power HF. With reference to FIG. 5, the period of the pulsed waves of the radio-frequency power HF may be in synchronization with the period of the pulsed bias electric power. With reference to FIG. 5, the term H in the period of the pulsed radio-frequency power HF may be in synchronization with the term H in the period of the pulsed bias electric power. Alternatively, the term H in the period of the pulsed radio-frequency power HF need not be in synchronization with the term H in the period of the pulsed bias electric power. The term H of the period of the pulsed radio-frequency power HF may be the same as or different from the term H of the period of the pulsed bias electric power.

FIG. 7 is an exemplary timing chart in the method according to an exemplary embodiment where the horizontal axis indicates time while the vertical axis indicates the level of the radio-frequency power HF, the level of the bias electric power, supply of a first gas, and supply of a second gas. The level "L" in the radio-frequency power HF indicates that no radio-frequency power HF is supplied or the level of the radio-frequency power HF is lower than the level "H". The level "L" in the bias electric power indicates that no bias electric power is supplied to the bottom electrode 18 or the level of the bias electric power is lower than the level "H". The symbol "ON" in the supply of the first gas indicates that the first gas is being supplied into the chamber 10 whereas the symbol "OFF" indicates that the first gas is not being supplied into the chamber 10. The symbol "ON" in the supply of the second gas indicates that the second gas is being supplied into the chamber 10 whereas the symbol "OFF" indicates that the second gas is not being supplied into the chamber 10.

With reference to FIG. 7, the first gas and the second gas may alternately supplied to the chamber 10 in Step STP. The etching of silicon-containing film SF in Step ST2 is performed, mainly, during supply of the first gas to the chamber 10. The forming of the protective film PF in Step ST3 is performed, mainly, during supply of the second gas to the chamber 10.

Continuous radio-frequency power HF may be applied in Step STP, as depicted with a solid line in FIG. 7. Alternatively, pulsed radio-frequency power HF may be applied in Step STP, like the pulsed radio-frequency power HF shown in FIG. 5. Pulsed radio-frequency power HF is depicted with broken lines in FIG. 7. The term H within the period of the pulsed radio-frequency power HF is in synchronization with or partially overlap with the term during which the first gas is supplied to the chamber 10. In contrast, the term L within the period of the pulsed radio-frequency power HF is in synchronization with or partially overlap with the term during which the second gas is supplied to the chamber 10.

Alternatively, continuous bias electric power may be applied to the bottom electrode 18 in Step STP as shown by the solid line in FIG. 7. Alternatively, pulsed bias electric power may be applied to the bottom electrode 18 in Step STP, like the pulsed bias electric power shown in FIG. 5. The pulsed bias electric power is depicted with the broken lines in FIG. 7. The term H within the period of the pulsed bias-frequency power is in synchronization with or partially overlap with the term during which the first gas is supplied to the chamber 10. The term L within the period of the pulsed bias-frequency power is in synchronization with or partially overlap with the term during which the second gas is supplied to the chamber 10.

The effect achieved by applying pulsed bias electric power during etching does not lie in deposition nor mainly in etching, but lies in that an etching phase and a deposition phase separately occur. When bias electric power is supplied to the bottom electrode, etching mainly occurs. On the other hand, when bias electric power is not supplied to the bottom electrode, deposition mainly occurs. Applying the pulsed bias electric power achieves an etching phase and a deposition phase that occur alternately. In the etching phase, etching occurs after a protective film is formed to protect the side wall of the recess (hole) from side etching. Thus, a continuous phase including formation (deposition) of a protective film and subsequent etching enables controlled etching that reduces bowing of the side wall and meanwhile continuously increases the depth of the recess (hole). Variations in the duty cycle of pulses ((bias ON time)/(bias ON time+bias OFF time)) provide a mechanism of controlling the balance between the etching phase and the deposition phase. A longer bias OFF time facilitates formation of a thicker protective film and provides further protection from side etching. A longer bias ON time increases the etching rate and controls the time taken to reach a desired etching depth.

A first experiment for evaluation of the method MT will now be explained. Multiple sample substrates were prepared for the first experiment. Each sample substrate had a silicon oxide film and a mask formed on the silicon oxide film. The mask was made of an amorphous carbon film. In the first experiment, Step STP in the method MT was applied to each sample substrate. The process gases used for these sample substrates contained $PF_3$ gas at different flow rates. Other conditions in Step STP are shown below, where the flow rates of the $PF_3$ gas were 0 sccm, 15 sccm, 30 sccm, 50 sccm, and 100 sccm, respectively, in other words, the ratios of the flow rate of the second gas to the flow rate of the first gas were 0, 0.075, 0.15, 0.25, and 0.5, respectively.

<Conditions in Step STP>

Gas pressure in chamber 10: 25 mTorr (3.3 Pa)

Process gas: 50 sccm of $CH_4$ gas, 100 sccm of $CF_4$ gas, and 50 sccm of $O_2$ gas Radio-frequency power HF (continuous wave): 40 MHz, 4500 W Radio-frequency power LF (continuous wave): 400 kHz, 7000 W Sample substrate temperature (temperature of substrate support before etching): −30° C.

Execution time in Step STP: 600 seconds

Figure 8:
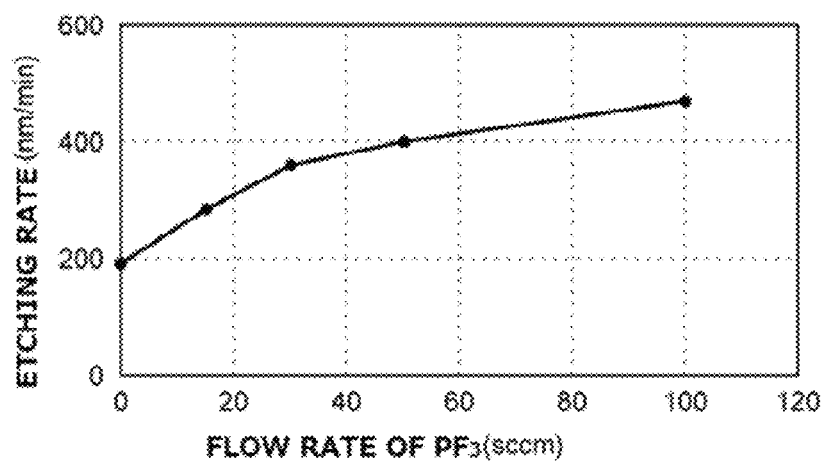
FIG. 8 is a graph illustrating a relation between the flow rate of $PF_3$ gas in the process gas and the etching rate of the silicon oxide film in a first experiment.
Figure 9:
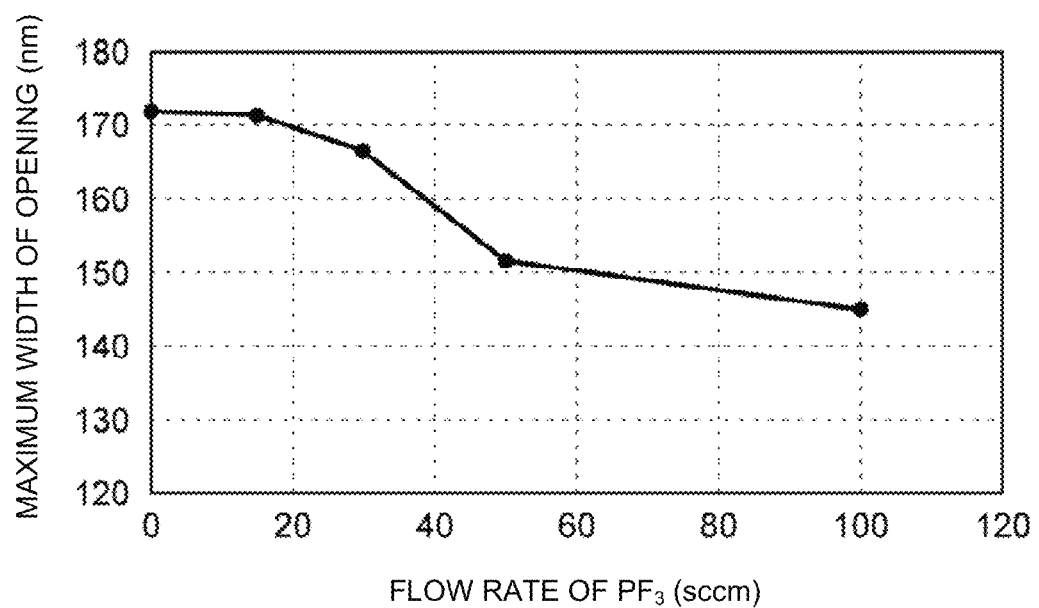
FIG. 9 is a graph illustrating a relation between the flow rate of $PF_3$ gas in the process gas and the maximum width of a recess formed in the silicon oxide film in the first experiment.
Figure 10:
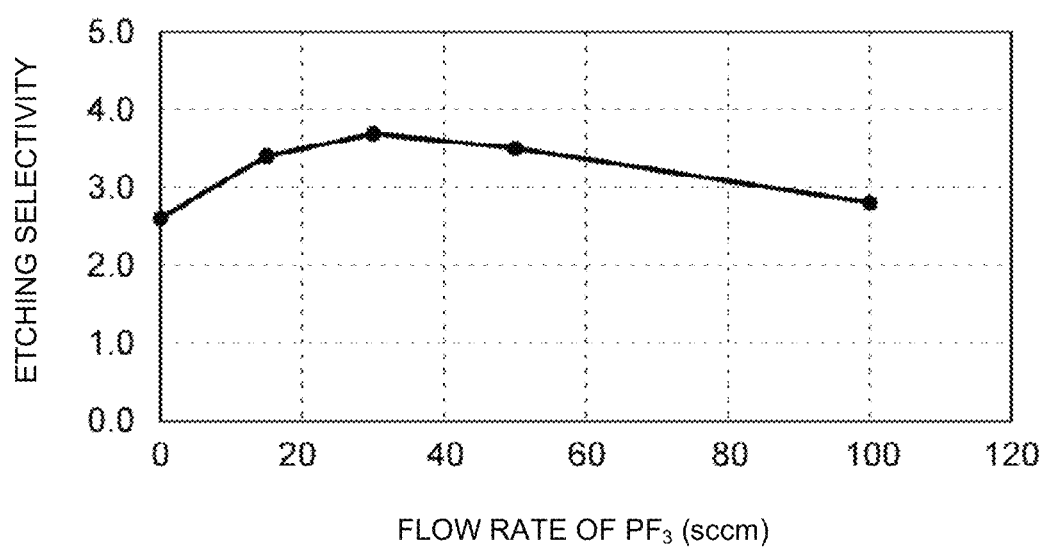
FIG. 10 is a graph illustrating a relation between the flow rate of $PF_3$ in the process gas and the etching selectivity in the first experiment.

In the first experiment, the maximum width of the recess formed in the silicon oxide film, the etching rate of the silicon oxide film, and the etching selectivity of each sample substrate were determined. The etching selectivity is a value of the etching rate of the silicon oxide film divided by the etching rate of the mask. The relation between the flow rate of the $PF_3$ gas in the process gas used in Step STP and the etching rate of the silicon oxide film was then determined. The relation between the flow rate of the $PF_3$ gas in the process gas used in Step STP and the maximum width of the recess in the silicon oxide film was also determined. In addition, the relation between the flow rate of the $PF_3$ gas in the process gas used in Step STP and the etching selectivity was determined. FIG. 8 shows the relation between the flow rate of the $PF_3$ gas of the process gas and the etching rate of the silicon oxide film. FIG. 9 shows the relation between the flow rate of the $PF_3$ gas of the process gas and the maximum width of the recess formed in the silicon oxide film. FIG. 10 shows the relation between the flow rate of the $PF_3$ gas of the process gas and the etching selectivity.

FIGS. 8 and 10 demonstrate that the etching rate and the etching selectivity of the silicon oxide film increase in the case that the process gas contains a phosphorus component, in other words, the ratio of the flow rate is greater than 0. FIG. 10 also demonstrates that the etching selectivity is considerably high in the case that the flow rate of $PF_3$ gas in the process gas is in the range from 15 sccm or more to 50 sccm or less or 60 sccm, in other words, in the case that the ratio of the flow rate is in the range from 0.075 or more to 0.25 or less or 0.3. FIG. 8 demonstrates that the etching rate at a flow rate of the $PF_3$ gas in the process gas of 20 sccm or more or at a ratio of the flow rate of 0.1 or more is about 1.5 times the etching in the case that no $PF_3$ is added.

FIG. 9 demonstrates that a process gas containing a phosphorus component causes decrease in the maximum width of the recess formed in the silicon oxide film, in other words, reduces partial expansion of the recess in the silicon oxide film. At a flow rate of the $PF_3$ gas in the process gas of 50 sccm or more, partial expansion of the recess in the silicon oxide film can be reduced.

In FIG. 9, the horizontal axis indicates the flow rate of the $PF_3$ gas, and the vertical axis indicates the maximum width of the etching recess (hole). The amount of fluorine component, that is, etchant increases with the flow rate of the $PF_3$ gas, and the increase in etchant causes increase in etching rate (see FIG. 8). As the flow rate of the $PF_3$ gas increases, the etching rate in the vertical direction increases. However, although the flow rate of $PF_3$ gas increases, the maximum width of the recess (hole) is substantially constant (actually, slightly decreases) up to 15 sccm (7.5%). At the flow rate exceeding 15 sccm (7.5%), the maximum width of the recess (hole) decreases. The use of the phosphorus gas component during etching thus effectively reduces side etching (bowing).

The protective film containing P—O bonds has a low volatility (that is, chemically strong). As recognized by the inventor of the present disclosure, the presence of the protective film having P—O bonds is effective in protecting the side wall of the recess in the silicon-containing film from erosion by ions having relatively low energy. On the other hand, ions impinging on the bottom of the recess (hole) has high energy and therefore removes (etches) the bottom of the recess, in spite of the protective film formed on the bottom of the recess. The protective film having P—O bonds thus has a selective protective function for undesired etching of the side wall. This is because the protective film having P—O bonds is chemically strong enough to avoid being removed by ions with low energy colliding against the side wall at a shallow angle. On the other hand, ions with high energy colliding against the bottom of the recess on direct impact have high energy enough to etch away the protective film having P—O bonds at the bottom of the recess. Consequently, this reduces bowing of the side wall and enables etching with a high aspect ratio.

A second experiment for evaluation of the method MT will now be explained. Multiple sample substrates were prepared for the second experiment. Each sample substrate had a silicon-containing film and a mask formed on the silicon-containing film. The silicon-containing film was a stack of alternately stacked silicon oxide sublayers and silicon nitride sublayers. The mask was made of an amorphous carbon film. In the second experiment, Step STP in the method MT was applied to each sample substrate. The process gases used for these sample substrates contained $PF_3$ gas at different flow rates. Other conditions in Step STP are shown below, where the flow rates of the $PF_3$ gas were 0 sccm, 5 sccm, 20 sccm, and 30 sccm, respectively.

<Conditions in Step STP>

Gas pressure in chamber 10: 25 mTorr (3.3 Pa)

Process gas: a gas mixture including a fluorine gas component, a hydrofluorocarbon gas component, a halogen gas component containing a halogen component other than fluorine component, and $PF_3$ gas Radio-frequency power HF: 40 MHz, 5500 W Radio-frequency power LF: 400 kHz, 8400 W Sample substrate temperature (temperature of substrate support before etching): −30° C.

Figure 11:
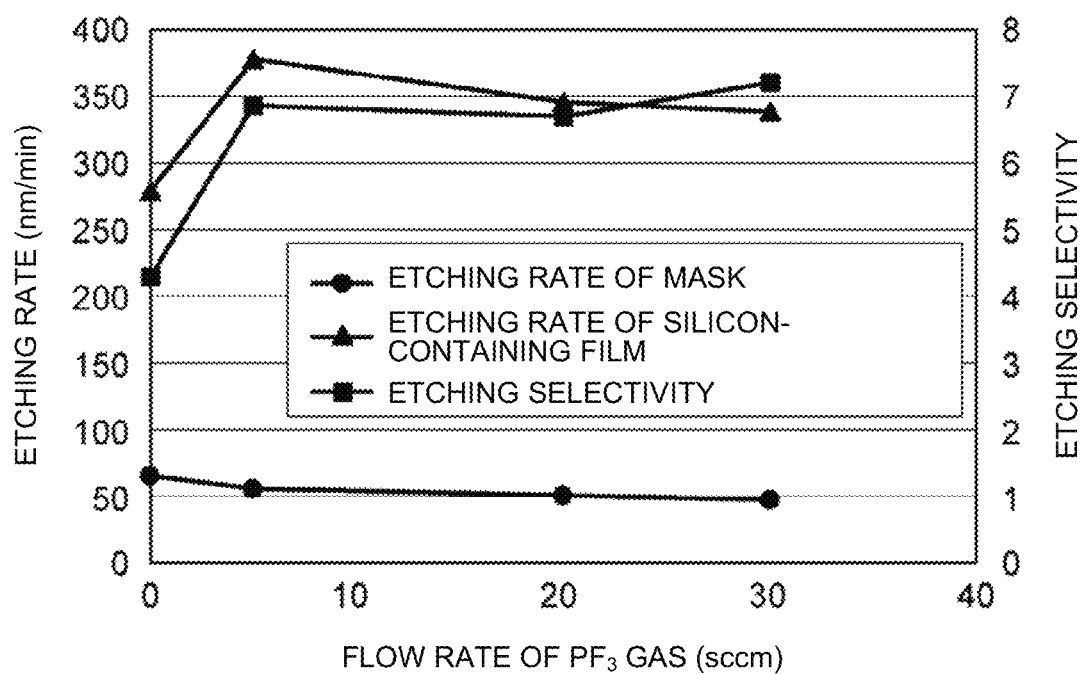
FIG. 11 is a graph illustrating a relation between the flow rate of $PF_3$ gas and each of the etching rate of the silicon-containing film, the etching rate of the mask, and the etching selectivity in a second experiment.

In the second experiment, the etching rate of the silicon-containing film, the etching rate of the mask, and the etching selectivity for each sample substrate were determined. The etching selectivity is a value of the etching rate of the silicon-containing film divided by the etching rate of the mask. In the second experiment, the relation between the flow rate of $PF_3$ gas and each of the etching rate of the silicon-containing film, the etching rate of the mask, and the etching selectivity was determined. FIG. 11 shows the relation between the flow rate of $PF_3$ gas and each of the etching rate of the silicon-containing film, the etching rate of the mask, and the etching selectivity in the second experiment. As illustrated in FIG. 11, the result of the second experiment has demonstrated that even when the flow rate of $PF_3$ gas added to the process gas is small, the etching rate of the silicon-containing film increases. It has also been demonstrated that even when the flow rate of $PF_3$ gas added to the process gas is small, the selectivity increases.

Figure 12:
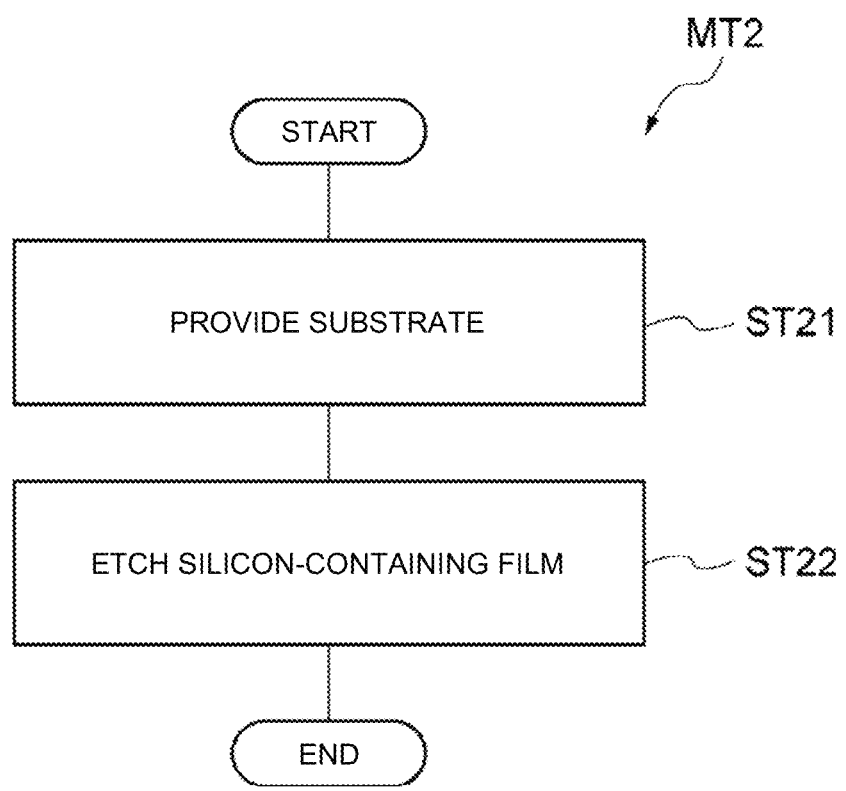
FIG. 12 is a flow chart of another etching method according to the present disclosure.

Referring to FIG. 12, another exemplary etching method of the present disclosure will now be described. The etching method illustrated in FIG. 12 (hereinafter referred to as "method MT2") is applied to a substrate having a silicon-containing film. The substrate to which the method MT2 is applied is, for example, the substrate W illustrated in FIG. 2 and has a silicon-containing film SF. In the method MT2, the silicon-containing film SF is etched. The silicon-containing film etched in the method MT2 is the silicon-containing film SF described above in connection with the method MT. The substrate W to which the method MT2 is applied may further include a mask MK and an underlying region UR as described above in connection with the method MT.

In the method MT2, a plasma treatment system is used for etching the silicon-containing film SF. The plasma treatment system used in the method MT2 is, for example, the plasma treatment system 1 described above.

The method MT2 applied to the substrate W illustrated in FIG. 2 using the plasma treatment system 1 will now be described as an example. When the plasma treatment system 1 is used, the method MT2 may be performed in the plasma treatment system 1 under the control of the controller 80 on each component in the plasma treatment system 1. The control on each component in the plasma treatment system 1 by the controller 80 for performing the method MT2 will be described below.

Figure 13:
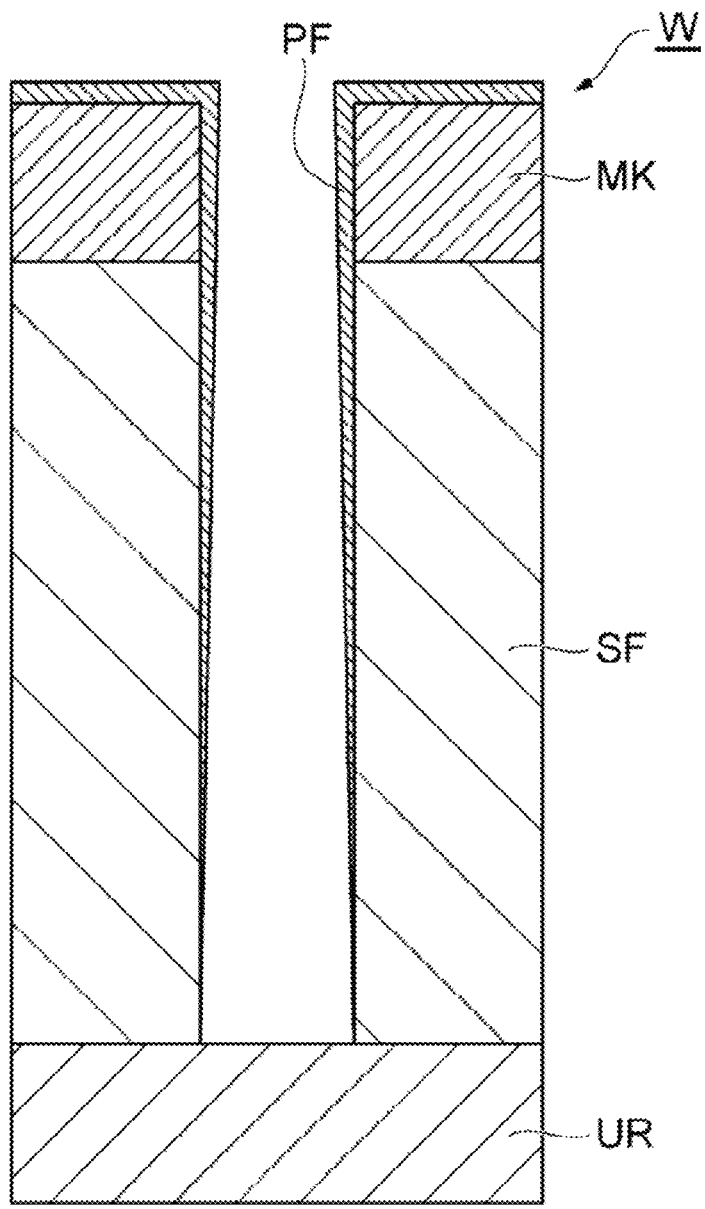
FIG. 13 is a partially enlarged cross-sectional view of an exemplary substrate to which the method shown in FIG. 12 is applied.
Figure 14:
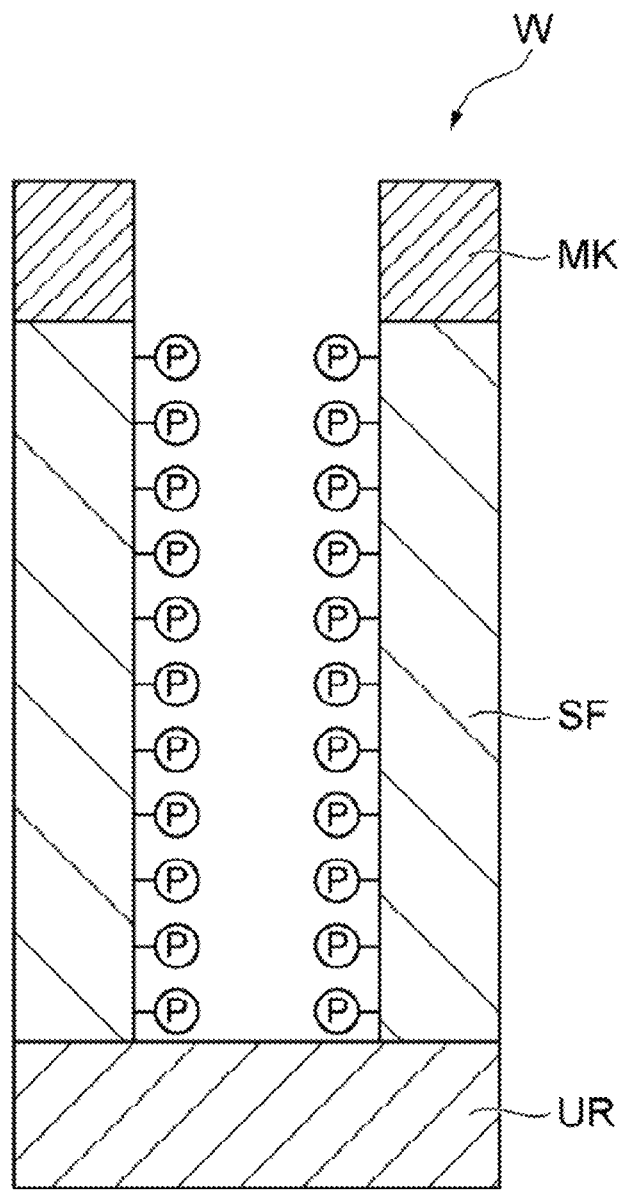
FIG. 14 is a partially enlarged cross-sectional view of an exemplary substrate to which the method shown in FIG. 12 is applied.
Figure 15:
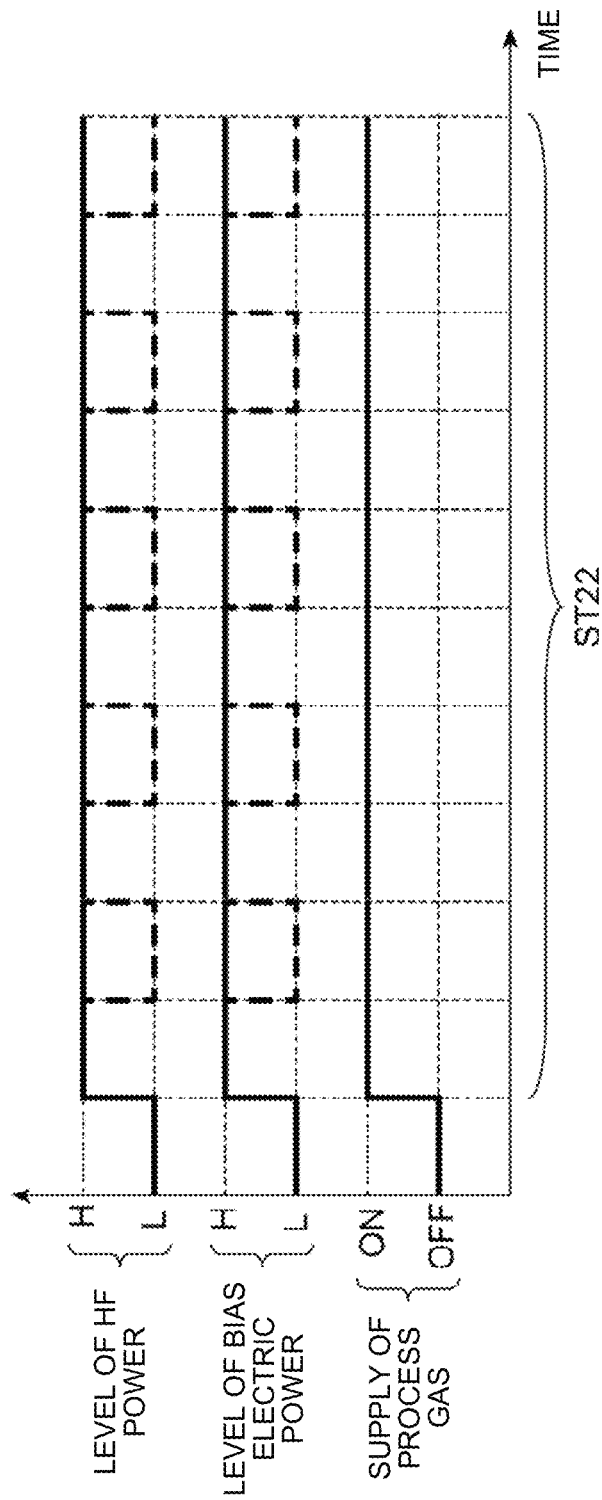
FIG. 15 is another exemplary timing chart according to the present disclosure.

In the following description, FIG. 12 as well as FIG. 13, FIG. 14, and FIG. 15 will be referred to. FIG. 13 and FIG. 14 each are a partially enlarged cross-sectional view of an exemplary substrate to which the method shown in FIG. 12 is applied. FIG. 15 is another exemplary timing chart according to the present disclosure where the horizontal axis indicates time while the vertical axis indicates the level of the radio-frequency power HF, the level of the bias electric power, and the supply of the process gas, in the same manner as the vertical axis in FIG. 7. The level "L" in the radio-frequency power HF indicates that no radio-frequency power HF is supplied or the level of the radio-frequency power HF is lower than the level "H". The level "L" in the bias electric power indicates that no bias electric power is applied to the bottom electrode 18 or the level of the bias electric power is lower than the level "H". The symbol "ON" in the supply of the process gas indicates that the process gas is being supplied into the chamber 10 whereas the symbol "OFF" indicates that the process gas is not being supplied into the chamber 10.

With reference to FIG. 12, the method MT2 starts with Step ST21. In Step ST21, the substrate W is disposed in the chamber 10, in the same manner as Step ST1 in the method MT.

In the method MT2, Step ST22 is then performed. In Step ST22, the silicon-containing film SF is etched by a chemical species in plasma generated from the process gas in the chamber 10.

The process gas used in Step ST22 includes a hydrogen fluoride gas component, a phosphorus gas component, and a carbon gas component. The process gas may further include a rare gas. The process gas may further include a fluorine-free halogen gas component. The fluorine-free halogen gas component contains, for example, at least one of $Cl_2$, HBr, and $BCl_3$. The process gas may further include an oxygen gas component. The oxygen gas component contains, for example, $O_2$.

In the process gas used in Step ST22, the phosphorus gas component is the phosphorus gas component described above in connection with the method MT. In the process gas used in Step ST22, the carbon gas component contains at least one of hydrocarbon ($C_xH_y$), hydrofluorocarbon ($C_sH_tF_u$), and fluorocarbon ($C_vF_w$), where x, y, s, t, u, v, and w each are a natural number. The hydrocarbon is, for example, at least one of $CH_4$, $C_3H_6$, and the like. The hydrofluorocarbon is, for example, at least one of $CH_2F_2$, $CHF_3$, $CH_3F$, $C_2HF_5$, $C_3H_2F_4$, $C_3H_2F_6$, $C_4H_2F_6$ and the like. The fluorocarbon is, for example, at least one of $CF_4$, $C_2F_6$, $C_3F_6$, $C_3F_8$, $C_4F_6$, $C_4F_8$, $C_5F_8$, and the like. When a carbon gas component containing at least two carbon atoms is used, the effect of protecting the side wall surface that defines the recess in the mask MK and the silicon-containing film SF may be increased.

In one embodiment, in the process gas used in Step ST22, the flow rate of the hydrogen fluoride gas component may be largest among the flow rate of the hydrogen fluoride gas component, the flow rate of the phosphorus gas component, and the flow rate of the carbon gas component. When the process gas used in Step ST22 includes a rare gas, the flow rate of the hydrogen fluoride gas component may be largest among the flow rates of all the gases in the process gas, excluding the rare gas. The proportion of the flow rate of the hydrogen fluoride gas component to the flow rate of the process gas if the process gas does not include a rare gas, or to the flow rate of the process gas excluding a rare gas if the process gas includes a rare gas, may be 50% or more and less than 99%. The proportion of the flow rate of the phosphorous gas component to the flow rate of the process gas if the process gas does not include a rare gas, or to the flow rate of the process gas excluding a rare gas if the process gas includes a rare gas, may be 1% or more and 20% or less. In the process gas, the proportion of the flow rate of the phosphorus gas component in the sum of the flow rate of the hydrogen fluoride gas component, the flow rate of the phosphorus gas component, and the flow rate of the carbon gas component may be 2% or more. The proportion of the flow rate of the carbon gas component to the flow rate of the process gas if the process gas does not include a rare gas, or to the flow rate of the process gas excluding a rare gas if the process gas includes a rare gas, may be above 0% and 20% or less.

In one embodiment, in the process gas used in Step ST22, the proportion of the flow rate of the halogen gas component in the sum of the flow rate of the hydrogen fluoride gas, the flow rate of the phosphorus gas component, the carbon gas component, and the flow rate of the halogen gas component may be above 0% and 10% or less.

In Step ST22, the controller 80 controls the gas supply unit to supply the process gas into the chamber 10. The controller 80 also controls the evacuation system 50 such that the gas pressure in the chamber 10 is regulated within a predetermined pressure. In addition, the controller 80 controls the plasma generator to generate plasma from the process gas. In the plasma treatment system 1, the controller 80 controls the radio-frequency power source 62 and the bias power source 64 to supply the radio-frequency power HF, the radio-frequency power LF, or the radio-frequency power HF and the bias electric power.

In one embodiment, the substrate support 14 (specifically, the electrostatic chuck 20) in Step ST22 may be kept at a temperature of 0° C. or less or −40° C. or less. At such a temperature, the etching rate of the silicon-containing film SF on the substrate W increases in Step ST22. The controller 80 may control a chiller to adjust the temperature of the substrate support 14 in Step ST22.

In Step ST22, as illustrated in FIG. 13 and FIG. 14, the silicon-containing film SF is etched by the halogen chemical species in plasma generated from the process gas. The halogen chemical species include a fluorine chemical species generated from the hydrogen fluoride gas component. Hydrogen fluoride has a small molecular weight, and the sputtering effect on the mask MK by a chemical species generated from hydrogen fluoride is small so that etching of the mask MK is suppressed. The plasma generated from the hydrogen fluoride gas component therefore can etch the silicon-containing film SF while suppressing etching of the mask MK. The plasma generated from the hydrogen fluoride gas component can also increase the etching rate of the silicon-containing film SF. In addition, a chemical species generated from the carbon gas component protects the mask MK. The more carbon atoms are contained in the molecule in the carbon gas component, the higher the effect of protecting the mask MK is. Furthermore, the plasma generated from the phosphorus gas component may suppress etching of the mask MK. In addition, in the presence of the phosphorous chemical species generated from the phosphorus gas component on a surface of the substrate W, adsorption of a chemical species generated from hydrogen fluoride gas component, that is, etchant to the substrate W is promoted. More specifically, in the presence of the phosphorous chemical species generated from the phosphorus gas component on a surface of the substrate W, supply of the etchant to the bottom of the hole (recess) is promoted and the etching rate of the silicon-containing film SF is thereby enhanced. The method MT2 thus can increase the etching rate and the etching selectivity in plasma etching of the silicon-containing film SF. When the phosphorus gas component in the process gas contains the halogen component as described above and/or when the process gas includes the halogen gas component described above, the etching rate of the silicon-containing film SF is further enhanced. Instead of the hydrogen fluoride gas component, a hydrogen gas component and a fluorine gas component may be used with a phosphorus gas component to achieve an effect similar to the effect achieved by the hydrogen fluoride gas component. The hydrogen gas component is, for example, $H_2$ gas and/or hydrofluorocarbon gas. An example of the fluorine gas component is fluorocarbon gas.

In Step ST22, phosphorous chemical species (ions and/or radicals) are supplied from plasma generated from the phosphorus gas component to the substrate W. With reference to FIG. 13, the phosphorous chemical species may form a protective film PF containing phosphorous on the surface of the substrate W. The protective film PF may further contain carbon and/or hydrogen contained in the process gas. In one embodiment, the protective film PF may further contain oxygen contained in the process gas or in the silicon-containing film SF. In one embodiment, the protective film PF may include phosphorous-oxygen bonds.

Instead of forming the protective film PF or in addition to forming the protective film PF, the phosphorous chemical species may form phosphorus bonds with a source included in the silicon-containing film SF at the side wall surface defining a recess in the silicon-containing film SF. When the silicon-containing film SF includes a silicon oxide film, the phosphorous chemical species forms phosphorous-oxygen bonds at the side wall surface of the silicon-containing film SF. In FIG. 14, phosphorous is depicted as "P" surrounded by a circle. In Step ST22, the side wall surface of the silicon-containing film SF is inactivated (or passivated) by the phosphorous chemical species. In other words, the side wall surface of the silicon-containing film SF undergoes passivation.

The method MT2 thus reduces etching of the side wall surface of the silicon-containing film SF and the lateral expansion of the recess in the silicon-containing film SF.

When the mask MK contains carbon, the phosphorous chemical species may form carbon-phosphorous bonds on the surface of the mask MK. The carbon-phosphorous bonds have higher bonding energy than carbon-carbon bonds in the mask MK. The method MT2 thus can protect the mask MK in plasma etching of the silicon-containing film SF.

As illustrated in FIG. 15, in Step ST22, continuous or pulsed radio-frequency power HF may be supplied, in the same manner as the continuous or pulsed radio-frequency power HF in Step STP explained with reference to FIG. 7. Alternatively, in Step ST22, continuous or pulsed bias electric power may be supplied, in the same manner as the continuous or pulsed bias electric power in Step STP explained with reference to FIG. 7.

Specifically, in one embodiment, as depicted by a broken line in FIG. 15, the pulsed bias electric power may be applied from the bias power source 64 to the bottom electrode 18 in Step ST22. In other words, when plasma generated from the process gas is present in the chamber 10, the pulsed bias electric power may be applied from the bias power source 64 to the bottom electrode 18. In this embodiment, the silicon-containing film SF is etched mainly within the term H in the period of the pulsed bias electric power in Step ST22. The formation and/or the passivation of the protective film PF in Step ST22 is performed mainly in the term L in the period of the pulsed bias electric power.

In one embodiment, as depicted by a broken line in FIG. 15, the pulsed radio-frequency power HF may be supplied in Step ST22. As illustrated in the FIG. 15, the period of the pulsed radio-frequency power HF may be synchronized with the period of the pulsed bias electric power. As illustrated in the FIG. 15, the term H in the period of the pulsed radio-frequency power HF may be in synchronization with the term H in the period of the pulsed bias electric power. Alternatively, the term H in the period of the pulsed radio-frequency power HF may not be in synchronization with the term H in the period of the pulsed bias electric power. The length of the term H in the period of the pulsed radio-frequency power HF may be the same as or different from the length of the term H in the period of the pulsed bias electric power.

Experiments for evaluation of the method MT2 will now be explained. The experiments described below are not intended to limit the present disclosure.

(Third to Sixth Experiments)

In third to sixth experiments, multiple sample substrates having the same structure as the substrate W does illustrated in FIG. 2 were prepared. Each sample substrate had a silicon-containing film and a mask formed on the silicon-containing film. The silicon-containing film had a multilayer configuration including alternately stacked silicon oxide sublayers and silicon nitride sublayers. The mask was made of an amorphous carbon film. In each of the third to sixth experiments, the plasma treatment system 1 was used to generate a plasma from the process gas and etch the silicon-containing film of the sample substrate. The process gas used in the third experiment contained $H_2$ gas component, a hydrofluorocarbon gas component, a fluorocarbon gas component, a fluorine gas component, and a halogen gas component. The process gas used in the fourth experiment contained $PF_3$ gas in addition to the process gas in the third experiment. The process gas used in the fifth experiment contained a hydrogen fluoride gas component, a fluorocarbon gas, and oxygen gas. The process gas used in the sixth experiment contained a hydrogen fluoride gas component, a fluorocarbon gas, and $PF_3$ gas. Other conditions in the third to sixth experiments are shown below.

<Other Conditions in Third to Sixth Experiments>

Gas pressure in chamber 10: 27 mTorr (3.6 Pa)

Radio-frequency power HF (continuous wave): 40 MHz, 4400 W

Radio-frequency power LF (continuous wave): 400 kHz, 6000 W

Temperature of substrate support 14: −40° C.

In each of the third to sixth experiments, the etching rate of the silicon-containing film, the etching selectivity, and the maximum width (bowing CD) of the recess formed in the silicon-containing film were determined from the result of etching of the silicon-containing film. The etching selectivity is a value of the etching rate of the silicon-containing film divided by the etching rate of the mask. The etching rates of the silicon-containing film in the third to sixth experiments were 310 nm/min, 336 nm/min, 296 nm/min, and 597 nm/min, respectively. The etching selectivities in the third to sixth experiments were 3.24, 4.1, 6.52, and 7.94, respectively. The bowing CDs in the third to sixth experiments were 106 nm, 104 nm, 128 nm, and 104 nm, respectively. The results in the third to sixth experiments have demonstrated that both of a higher etching rate and a high etching selectivity were obtained and a smaller bowing CD was obtained in the fourth and sixth experiments, compared with the third and fifth experiments. In particular, in the sixth experiment, the etching rate was about twice the etching rate in the third experiment. It has been demonstrated that the use of the process gas including a hydrogen fluoride gas component, a carbon gas component, and a phosphorus gas component in plasma etching of the silicon-containing film can enhance the etching rate and the etching selectivity. It has also been demonstrated that the use of the process gas including a hydrogen fluoride gas component, a carbon gas component, and a phosphorus gas component in plasma etching of the silicon-containing film reduces the lateral expansion of the recess in the silicon-containing film.

(Seventh Experiment)

In a seventh experiment, the same sample substrates as the sample substrates prepared in the third to sixth experiments were prepared. In the seventh experiment, the plasma treatment system 1 was used to generate plasma from the process gas and etch the silicon-containing film of each sample substrate. The process gas used in the seventh experiment included a hydrogen fluoride gas component and a fluorocarbon gas component. In the seventh experiment, the proportions of the flow rate of $PF_3$ gas in the process gases used for the sample substrates were different. Here, the proportion of the flow rate of $PF_3$ gas is the proportion of the flow rate of the $PF_3$ gas to the flow rate of the process gas. Other conditions in the seventh experiment are the same as the corresponding conditions in the third to sixth experiments described above.

Figure 16:
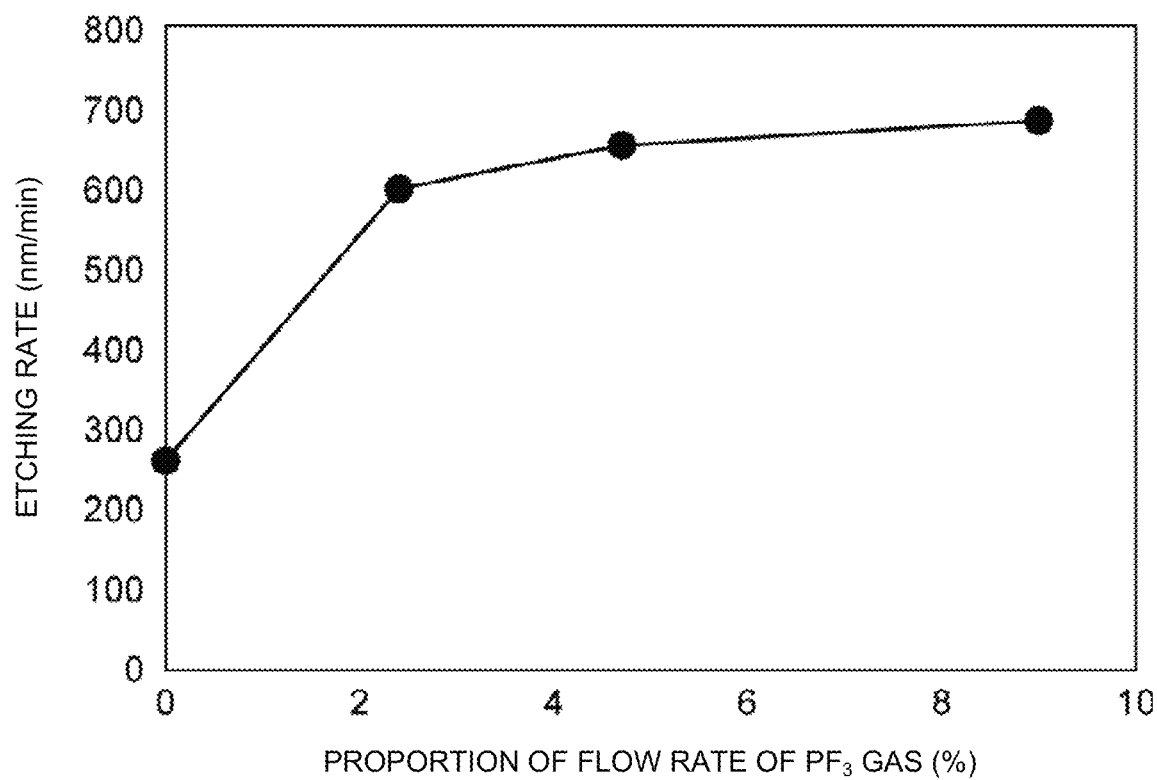
FIG. 16 is a graph illustrating the result of a seventh experiment.

In the seventh experiment, the etching rate of the silicon-containing film was determined from the result of etching of the silicon-containing film of each sample substrate. The relation between the proportion of the flow rate of $PF_3$ gas and the etching rate of the silicon-containing film was determined. The result is illustrated in FIG. 16. FIG. 16 demonstrates that the etching rate is high when the proportion of the flow rate of $PF_3$ gas to the flow rate of the process gas is 2% or more (or 2.5% or more). In other words, a high etching rate is achieved when the flow rate of the phosphorus gas component relative to the flow rate of the process gas including the hydrogen fluoride gas component, the carbon gas component, and the phosphorus gas component is 2% or more (or 2.5% or more).

(Eighth to Eleventh Experiments)

In each of an eighth experiment and a ninth experiment, multiple substrates each having a silicon oxide film were prepared. In each of the eighth experiment and the ninth experiment, the plasma treatment system 1 was used to generate a plasma from the process gas and etch the silicon oxide film of each sample substrate. In each of the eighth experiment and the ninth experiment, the temperatures of the substrate support 14 in etching of the silicon oxide films of the sample substrates were different. In each of a tenth experiment and an eleventh experiment, multiple substrates each having a silicon nitride film were prepared. In each of the tenth experiment and the eleventh experiment, the plasma treatment system 1 was used to generate plasma from the process gas and etch the silicon nitride film of each sample substrate. In each of the tenth experiment and the eleventh experiment, the temperatures of the substrate support 14 in etching of the silicon nitride films of the sample substrates were different. The process gas used in each of the eighth to eleventh experiments contained a hydrogen fluoride gas component and a fluorocarbon gas. The proportion of the flow rate of $PF_3$ gas to the flow rate of the process gas used in the eighth experiment and the tenth experiment was 2.5%. The process gas used in the ninth experiment and the eleventh experiment contained no $PF_3$ gas. Other conditions in the eighth to eleventh experiments were the same as the corresponding conditions in the third to sixth experiments described above.

Figure 17:
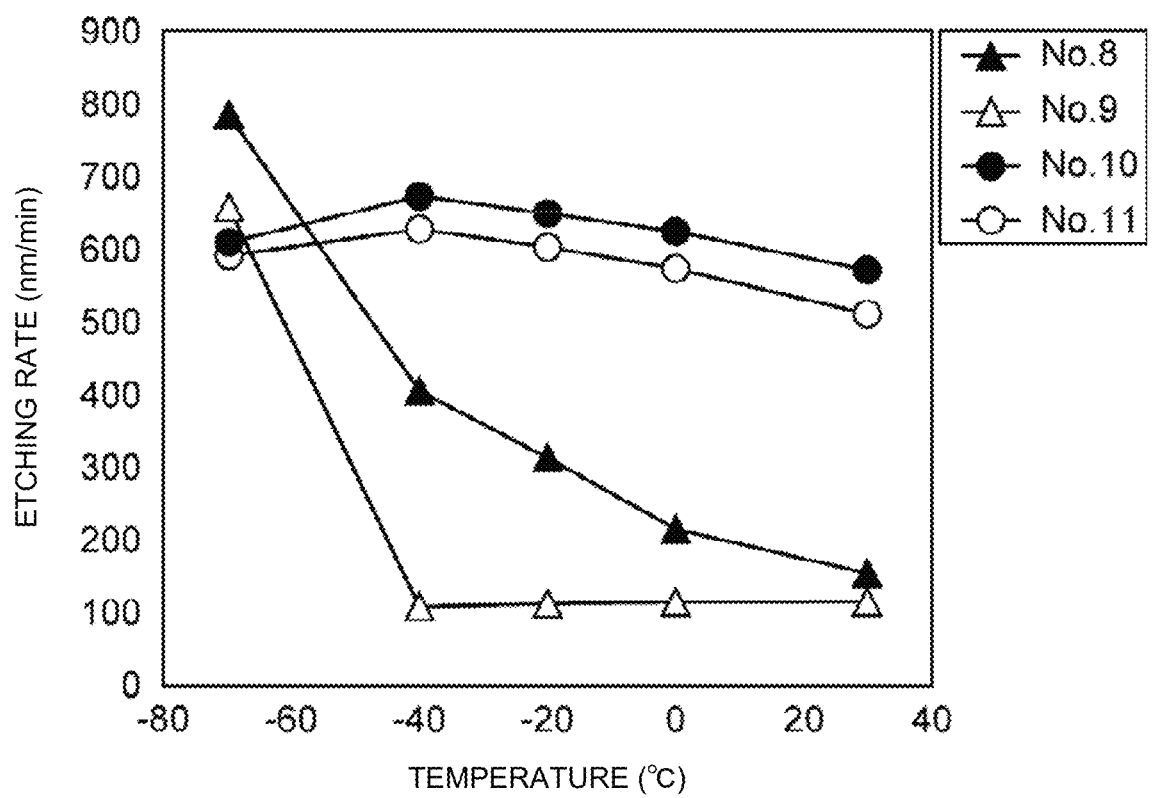
FIG. 17 is a graph illustrating the results of eighth to eleventh experiments.

In the eighth experiment and the ninth experiment, the etching rate of the silicon oxide film was determined from the result of etching of the silicon oxide film of each sample substrate. In the tenth experiment and the eleventh experiment, the etching rate of the silicon nitride film was determined from the result of etching of the silicon nitride film of each sample substrate. FIG. 17 illustrates the relation between the temperature of the substrate support 14 set in the eighth to eleventh experiments and the resulting etching rate. In FIG. 17, No. 8, No. 9, No. 10, and No. 11 indicate the results of the eighth to eleventh experiments, respectively. FIG. 17 demonstrates that the etching rate of the silicon oxide film is higher in the eighth experiment using the process gas including $PF_3$ gas than the etching rate of the silicon oxide film in the ninth experiment using the process gas including no $PF_3$ gas. The result in the eighth experiment also has demonstrated that the etching rate of the silicon oxide film is higher when the temperature of the substrate support 14 is set to 0° C. or less in the case of using the process gas including $PF_3$ gas. It has also been demonstrated that the etching rate of the silicon oxide film is significantly high when the temperature of the substrate support 14 is set to −40° C. or less in the case of using the process gas including $PF_3$ gas.

(Twelfth Experiment and Thirteenth Experiment)

Figure 18A:
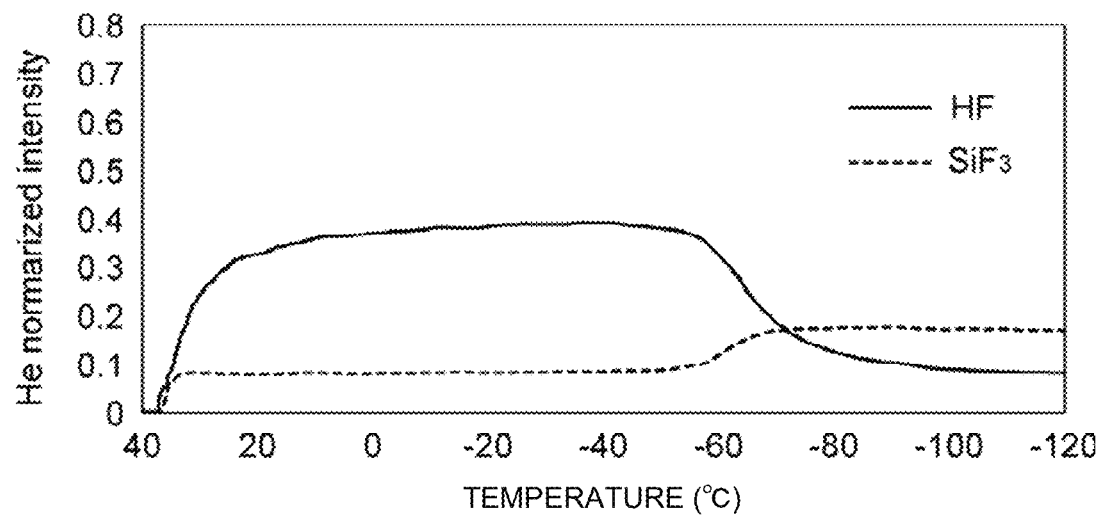
FIG. 18A is a graph illustrating the result of a twelfth experiment.
Figure 18B:
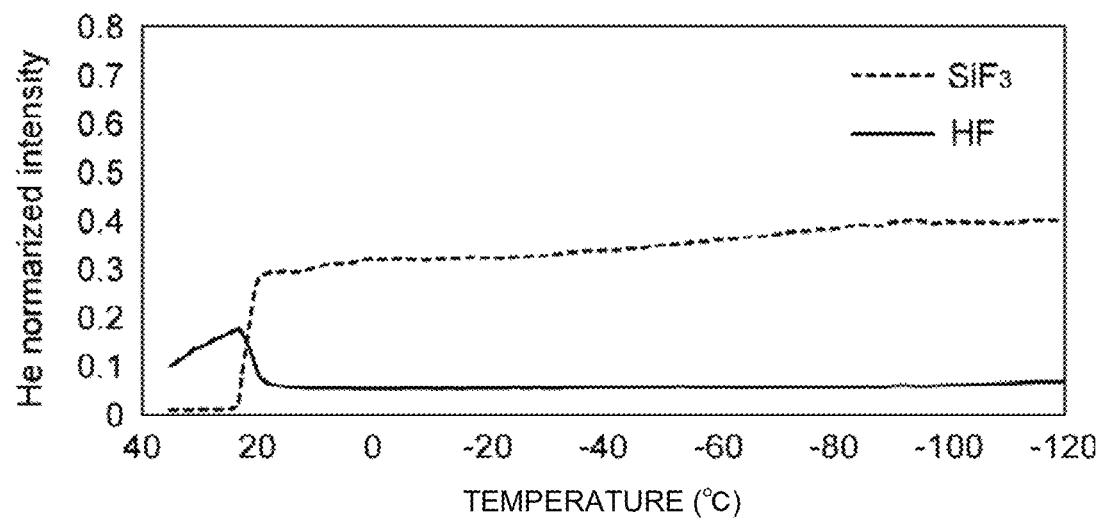
FIG. 18B is a graph illustrating the result of a thirteenth experiment.

In a twelfth experiment, the plasma treatment system 1 was used to generate plasma from the process gas which was a gas mixture of a hydrogen fluoride gas component and argon gas component, and etch the silicon oxide film. In a thirteenth experiment, the plasma treatment system 1 was used to generate plasma from the process gas which was a gas mixture of a hydrogen fluoride gas component, argon gas component, and $PF_3$ gas component, and etch the silicon oxide film. In the twelfth experiment and the thirteenth experiment, the temperature of the electrostatic chuck 20 was changed during etching of the silicon oxide film. In the twelfth experiment and the thirteenth experiment, the amount of hydrogen fluoride (HF) component and the amount of $SiF_3$ in a gas component phase during etching of the silicon oxide film were measured using a quadrupole mass spectrometer. FIGS. 18A and 18B illustrate the result of the twelfth experiment and the result of the thirteenth experiment. FIG. 18A illustrates the relation between the temperature of the electrostatic chuck 20 during etching of the silicon oxide film and each of the amount of hydrogen fluoride (HF) component and the amount of $SiF_3$ in the twelfth experiment. FIG. 18B illustrates the relation between the temperature of the electrostatic chuck 20 during etching of the silicon oxide film and each of the amount of hydrogen fluoride (HF) component and the amount of $SiF_3$ in the thirteenth experiment.

As illustrated in FIG. 18A, in the twelfth experiment, when the temperature of the electrostatic chuck 20 was approximately −60° C. or less, the amount of the etchant, that is, hydrogen fluoride (HF) component decreased, and the amount of $SiF_3$, which is a reaction product generated by etching of the silicon oxide film, increased. In other words, in the twelfth experiment, when the temperature of the electrostatic chuck 20 was approximately −60° C. or less, the amount of etchant used in the etching of the silicon oxide film increased. On the other hand, as illustrated in FIG. 18B, in the thirteenth experiment, when the temperature of the electrostatic chuck 20 was 20° C. or less, the amount of hydrogen fluoride (HF) component decreased and the amount of $SiF_3$ increased. In other words, in the thirteenth experiment, when the temperature of the electrostatic chuck 20 was approximately 20° C. or less, the amount of etchant used in the etching of the silicon oxide film increased. The process gas used in the thirteenth experiment differs from the process gas used in the twelfth experiment in that it includes $PF_3$ gas. In the thirteenth experiment, therefore, a phosphorous chemical species was present on the surface of the silicon oxide film during etching of the silicon oxide film. It can be understood that in the presence of the phosphorous chemical species on the surface of the silicon oxide film, adsorption of the etchant to the silicon oxide film was promoted although the temperature of the electrostatic chuck 20 was relatively as high as 20° C. or less. This has demonstrated that in the presence of the phosphorous chemical species on the surface of the substrate, supply of the etchant to the bottom of the hole (recess) is promoted and the etching rate of the silicon-containing film is thereby enhanced.

Fourteenth to sixteenth experiments for evaluation of the method MT and the method MT2 will now be described. In the fourteenth to sixteenth experiments, plasms of different process gases were generated using the plasma treatment system 1. The process gas used in the fourteenth experiment included a hydrogen gas component, a fluorine gas component, a halogen gas component containing a halogen component other than fluorine component, a hydrofluorocarbon gas component, a fluorocarbon gas component, and a hydrocarbon gas component. The process gas used in the fifteenth experiment included a hydrofluorocarbon gas component, a fluorine gas component, and a halogen gas component containing a halogen component other than fluorine component. The process gas used in the sixteenth experiment contained a hydrogen fluoride gas component and a fluorocarbon gas component. In each of the fourteenth to sixteenth experiments, the amount of chemical species in a gas phase in the chamber 10 was measured using a quadrupole mass spectrometer. The results of the fourteenth to sixteenth experiments showed that the largest amount of chemical species among the measured chemical species was hydrogen fluoride. Specifically, the amounts of hydrogen fluoride measured in the fourteenth to sixteenth experiments were 35.5%, 45.5%, and 66.7%, respectively. This has demonstrated that the amount of hydrogen fluoride in plasma is largest when the process gas includes hydrogen fluoride gas component.

Regardless of the various exemplary embodiments that have been described, any addition, elimination, replacement, and modification on these embodiments may be allowable. The components in different embodiments can be combined to form other embodiments.

For example, the plasma treatment system used in each of the method MT and the method MT2 may be a capacitively coupled plasma treatment system other than the plasma treatment system 1. Alternatively, the plasma treatment system used in each of the method MT and the method MT2 may be an inductively coupled plasma treatment system, an electron cyclotron resonance (ECR) plasma treatment system, or a plasma treatment system that generates plasma by using surface wave, for example, microwaves.

The plasma treatment system may also include another bias power source that applies pulses of DC voltage with negative polarity intermittently or periodically to the bottom electrode 18, in addition to the bias power source 64 that supplies the radio-frequency power LF to the bottom electrode 18.

Figure 19:
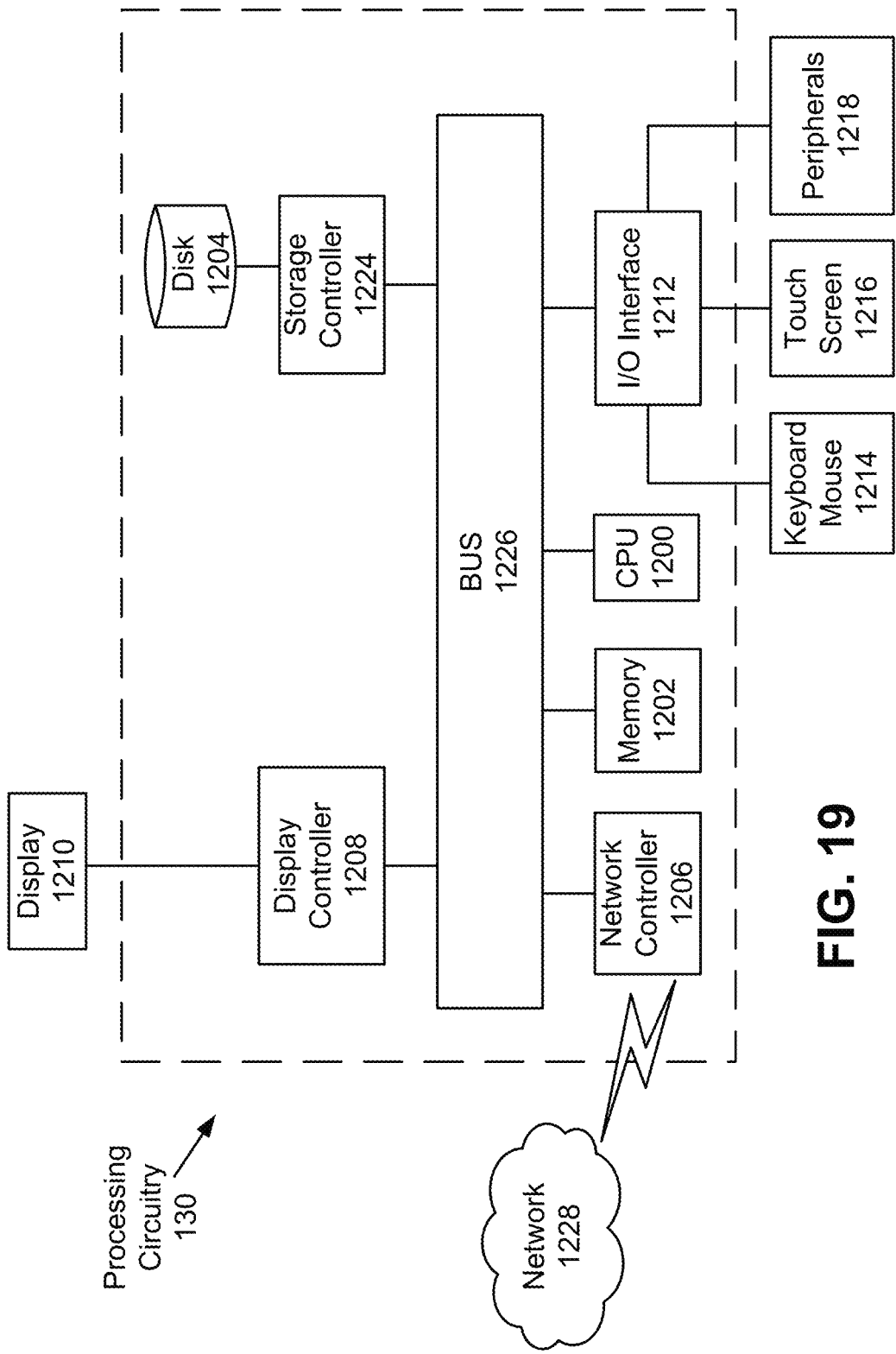
FIG. 19 is a diagram of controller circuitry that performs computer-based operations described herein.

FIG. 19 is a diagram of processing circuitry for performing computer-based operations described herein, especially with regard to controllers 41 and 80. FIG. 19 illustrates control circuitry 130 that may be used to control any computer-based control processes, such as process recipes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 19, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the processes in this disclosure are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above-described embodiments may be implemented by circuitry, which includes one or more processing circuits. A processing circuit includes a particularly programmed processor, for example, processor (CPU) 1200, as shown in FIG. 19. A processing circuit also includes devices such as an application specific integrated circuit (ASIC) and conventional circuit components arranged to perform the recited functions.

In FIG. 19, the processing circuitry 130 includes a CPU 1200 which performs the processes described above. The processing circuitry 130 may be a general-purpose computer or a particular, special-purpose machine. In one embodiment, the processing circuitry 130 becomes a particular, special-purpose machine when the processor 1200 is programmed to perform ESC in-situ replacement by controlling voltages and robot arms to replace the ESC without exposing the reaction chamber to an external atmosphere.

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the processes described above.

The processing circuitry 130 in FIG. 19 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The disclosed embodiments further include the following modes (A1) to (A17), (B1) to (B92), and (C1) to (C19).

(A1). A method of etching comprising:
A) providing a substrate including a silicon-containing film in a chamber of a plasma treatment system; and
B) etching the silicon-containing film with a chemical species in plasma generated from a process gas in the chamber, the process gas containing a halogen component and a phosphorus component.

(A2). The method of (A1) further comprising C) forming a protective film on a side wall of a recess formed during Step B, wherein
the protective film contains the phosphorous component contained in the process gas.

(A3). The method of (A2), wherein Steps B and C are carried out at the same time.

(A4). The method of any one of (A1) to (A3), wherein the process gas comprises at least one phosphorus compound selected from a group consisting of $PF_3$, $PCl_3$, $PF_5$, $PCl_5$, $POCl_3$, $PH_3$, $PBr_3$, and $PBr_5$ as a molecule containing the phosphorous component.

(A5). The method of any one of (A1) to (A4), wherein the process gas further contains a carbon component and a hydrogen component.

(A6). The method of (A5), wherein the process gas comprises at least one component selected from a group consisting of $H_2$, HF, $C_xH_y$, $CH_xF_y$, and $NH_3$, as a molecule containing the hydrogen component, where x and y are each natural number.

(A7). The method of any one of (A1) to (A6), wherein the halogen component is a fluorine component.

(A8). The method of any one of (A1) to (A7), wherein the process gas further comprises an oxygen component.

(A9). The method of any one of (A1) to (A8), wherein the silicon-containing film is a dielectric silicon-containing film.

(A10). The method of any one of (A1) to (A9), wherein the silicon-containing film comprises at least one film selected from a group consisting of a silicon oxide film, a silicon nitride film, and a silicon film.

(A11). The method of any one of (A1) to (A8), wherein the silicon-containing film comprises at least two different silicon-containing sublayers.

(A12). The method of (A11), wherein the at least two silicon-containing sublayers comprise a silicon oxide sublayer and a silicon nitride sublayer.

(A13). The method of (A11), wherein the at least two silicon-containing sublayers comprise a silicon oxide sublayer and a silicon sublayer.

(A14). The method of (A11), wherein the at least two silicon-containing sublayers comprise a silicon oxide sublayer, a silicon nitride sublayer, and a silicon sublayer.

(A15). The method of any one of (A1) to (A14), wherein the substrate further comprises a mask on the silicon-containing film.

(A16). The method of any one of (A1) to (A15), wherein the temperature of the substrate is set to 0° C. or less at the start of Step B.

(A17). A plasma treatment system comprising:
a chamber;
a substrate support configured to support a substrate in the chamber;
a gas supply unit configured to supply a process gas for etching a silicon-containing film into the chamber, the process gas containing a halogen component and a phosphorous component; and
a radio-frequency power source configured to generate radio-frequency power for generating plasma from the process gas in the chamber.

(B1). A method of etching comprising:
A) providing a substrate including a silicon-containing film in a chamber of a plasma treatment system; and
B) etching the silicon-containing film with a chemical species generated from a process gas plasma in the chamber, the process gas containing a halogen component and a phosphorus component, wherein the process gas contains a first phosphorus-free gas at a first flow rate and a second phosphorus gas component at a second flow rate; and the ratio of the second flow rate of the second gas to the first flow rate of the first gas is above 0 and 0.5 or less.

(B2). The method of (B1), wherein the ratio is 0.075 or more and 0.3 or less.

(B3). The method of (B1), wherein the ratio is 0.1 or more and 0.25 or less.

(B4). The method of any one of (B1) to (B3), wherein the process gas comprises $PF_3$ as a molecule containing the phosphorous component.

(B5). The method of any one of (B1) to (B3), wherein the process gas comprises at least one phosphorus compound selected from a group consisting of $PF_3$, $PCl_3$, $PF_5$, $PCl_5$, $POCl_3$, $PH_3$, $PBr_3$, and $PBr_5$ as a molecule containing the phosphorous component.

(B6). The method of any one of (B1) to (B5), wherein the process gas further comprises a carbon component and a hydrogen component.

(B7). The method of (B6), wherein the process gas comprises at least one component selected from a group consisting of $H_2$, HF, $C_xH_y$, $CH_xF_y$, and $NH_3$ as a molecule containing the hydrogen component, where x and y are each natural number.

(B8). The method of any one of (B1) to (B7), wherein the halogen component is a fluorine component.

(B9). The method of any one of (B1) to (B8), wherein the process gas comprises a fluorocarbon component as a molecule containing the halogen component.

(B10). The method of any one of (B1) to (B9), wherein the process gas further comprises an oxygen component.

(B11). The method of any one of (B1) to (B9), wherein the process gas is free of oxygen component.

(B12). The method of any one of (B1) to (B11), wherein a protective film is formed on a side wall of a recess formed during Step B.

(B13). The method of (B12), wherein the protective film contains phosphorus-oxygen bonds.

(B14). The method of (B13), wherein the protective film further contains phosphorus-silicon bonds.

(B15). The method of any one of (B1) to (B14), wherein the temperature of the substrate is set to 0° C. or less at the start of Step B.

(B16). The method of any one of (B1) to (B15), wherein a radio-frequency bias power of 2 kW or more is supplied to a lower electrode in a substrate support supporting the substrate in Step B.

(B17). The method of (B16), wherein the radio-frequency bias power is 10 kW or more.

(B18). A method of etching comprising:
A) providing a substrate comprising a silicon-containing film in a chamber of a plasma treatment system;
B) etching the silicon-containing film by a chemical species generated from a process gas containing a halogen component and a phosphorus component in the chamber to form a recess in the silicon-containing film; and
C) forming a protective film containing phosphorus-oxygen bonds derived from the phosphorus component contained in the process gas on a side wall of the recess.

(B19). The method of (B18), wherein Steps B and C are carried out at the same time.

(B20). The method of (B18), wherein Steps B and C are carried out independently.

(B21). The method of any one of (B18) to (B20), wherein the protective film has a thickness that decreases with the depth of the recess.

(B22). The method of any one of (B18) to (B21), wherein pulsed bias electric power are applied to a bottom electrode in a substrate support that supports the substrate for performing Steps B and C; and
the bias electric power is radio-frequency bias power or pulsed DC voltage with negative polarity.

(B23). The method of (B22), wherein the radio-frequency bias power supplied to the bottom electrode in Step B is 2 kW or more.

(B24). The method of (B23), wherein the radio-frequency bias power is 10 kW or more.

(B25). The method of any one of (B18) to (B24), wherein the plasma is generated by pulsed radio-frequency power.

(B26). The method of any one of (B18) to (B25), wherein the process gas comprises a first phosphorus-free gas component and a second phosphorus gas component.

(B27). The method of (B26), wherein the first gas and the second gas are alternately supplied to the chamber.

(B28). The method of (B26), wherein the ratio of the flow rate of the second gas to the flow rate of the first gas is above 0 and 0.5 or less.

(B29). The method of (B28), wherein the ratio is in the range from 0.075 to 0.3.

(B30). The method of (B28), wherein the ratio is in the range from 0.1 to 0.25.

(B31). The method of any one of (B18) to (B30), wherein the protective film further comprises phosphorous-silicon bonds.

(B32). The method of any one of (B18) to (B31), wherein the process gas comprises $PF_3$ as a molecule containing the phosphorous component.

(B33). The method of any one of (B18) to (B31), wherein the process gas comprises at least one phosphorus compound selected from a group consisting $PF_3$, $PCl_3$, $PF_5$, $PCl_5$, $POCl_3$, $PH_3$, $PBr_3$, and $PBr_5$ as a molecule containing the phosphorous component.

(B34). The method of any one of (B18) to (B33), wherein the process gas further comprises a carbon component and a hydrogen component.

(B35). The method of (B34), wherein the process gas comprises at least one component selected from a group consisting of $H_2$, HF, $C_xH_y$, $CH_xF_y$, and $NH_3$ as a molecule containing the hydrogen component, where x and y are each natural number.

(B36). The method of any one of (B18) to (B35), wherein the halogen component is a fluorine component.

(B37). The method of any one of (B18) to (B36), wherein the process comprises a fluorocarbon component as a molecule containing the halogen component.

(B38). The method of any one of (B18) to (B37), wherein the oxygen is supplied from the silicon-containing film.

(B39). The method of (B38), wherein the process gas is free of oxygen.

(B40). The method of any one of (B18) to (B37), wherein the process gas further comprises an oxygen component.

(B41). The method of any one of (B18) to (B40), wherein the temperature of the substrate is set to 0° C. or less at the start of Step B.

(B42). A method of etching comprising:
A) providing a substrate comprising a silicon-containing film in a chamber of a plasma treatment system;
B) generating plasma from a process gas containing a halogen component and a phosphorus component in the chamber; and C) applying pulsed bias electric power to a bottom electrode of a substrate support supporting the substrate in the presence of the plasma in the chamber, wherein the bias electric power is radio-frequency bias power or pulsed DC voltage with negative polarity.

(B43). The method of (B42), wherein supply of the bias electric power to be applied to the bottom electrode is alternately switched between continuation and cessation, thereby applying the pulsed bias electric power to the bottom electrode.

(B44). The method of (B42), wherein the level of the bias electric power is varied to apply the pulsed bias electric power to the bottom electrode.

(B45). The method of any one of (B42) to (B44), wherein
the pulsed bias electric power is periodically applied to the bottom electrode, each period of the pulsed bias electric power comprises a first term and a second term, the level of the pulsed bias electric power at the first term being higher than the level of the pulsed bias electric power at the second term, and the duty of the first term in the period is in the range from 1% to 80%.

(B46). The method of (B45), wherein the frequency defining the period is in the range from 5 Hz to 100 kHz.

(B47). The method of (B45) or (B46), wherein the level of the electric power at the first term is 2 kW or more.

(B48). The method of (B47), wherein the level of the electric power at the first term is 10 kW or more.

(B49). The method of any one of (B42) to (B48), wherein the process gas comprises a first phosphorus-free gas component and a second phosphorus gas component.

(B50). The method of (B49), wherein the first gas and the second gas are alternately supplied to the chamber.

(B51). The method of (B50), wherein the term during which the first gas is supplied at least partially overlaps with the term during which the bias electric power is applied to the bottom electrode.

(B52). The method of (B49), wherein the ratio of the flow rate of the second gas to the flow rate of the first gas is above 0 and 0.5 or less.

(B53). The method of (B52), wherein the ratio is in the range from 0.075 to 0.3.

(B54). The method of (B52), wherein the ratio is in the range from 0.1 to 0.25.

(B55). The method of any one of (B42) to (B54), wherein Step C comprises:

C1) etching the silicon-containing film to form a recess; and

C2) forming a protective film on the side face of the recess, wherein

Substep C1 and Substep C2 are carried out independently from each other.

(B56). The method of (B55), wherein the protective film contains phosphorus-oxygen bonds.

(B57). The method of (B56), wherein the protective film further contains phosphorus-silicon bonds.

(B58). The method of any one of (B42) to (B57), wherein the process gas comprises $PF_3$ as a molecule containing the phosphorus component.

(B59). The method of any one of (B42) to (B57), wherein the process gas comprises at least one phosphorus compound selected from a group consisting $PF_3$, $PCl_3$, $PF_5$, $PCl_5$, $POCl_3$, $PH_3$, $PBr_3$, and $PBr_5$ as a molecule containing the phosphorus component.

(B60). The method of any one of (B42) to (B59), wherein the process gas further comprises a carbon component and a hydrogen component.

(B61). The method of (B60), wherein the process gas comprises at least one component selected from a group consisting of $H_2$, HF, $C_xH_y$, $CH_xF_y$, $C_xH_yF_z$, and $NH_3$ as a molecule containing the hydrogen component, where x, y, and z are each natural number.

(B62). The method of any one of (B42) to (B61), wherein the halogen component is a fluorine component.

(B63). The method of any one of (B42) to (B62), wherein the process gas comprises a fluorocarbon as a molecule containing the halogen component.

(B64). The method of any one of (B42) to (B63), wherein the process gas further comprises an oxygen component.

(B65). The method of any one of (B42) to (B63), wherein the process gas is free of oxygen.

(B66). The method of any one of (B42) to (B65), wherein the temperature of the substrate is set to 0° C. or less at the start of Step B.

(B67). A method of etching comprising:

A) providing a substrate comprising at least two different silicon-containing films in a chamber of a plasma treatment system;

B) adjusting the substrate to a temperature of 0° C. or less; and

C) etching the silicon-containing films by a chemical species generated from a process gas containing $PF_3$ in the chamber.

(B68). The method of (B67), wherein the silicon-containing films are silicon oxide films.

(B69). The method of (B67) or (B68), wherein the process gas comprises a first phosphorus-free gas component and a second $PF_3$-containing gas component.

(B70). The method of (B69), wherein the ratio of the flow rate of the second gas to the flow rate of the first gas is above 0 and 0.5 or less.

(B71). The method of (B70), wherein the ratio is in the range from 0.075 to 0.3.

(B72). The method of (B70), wherein the ratio is in the range from 0.1 to 0.25.

(B73). The method of any one of (B67) to (B72), wherein the process gas further comprises a fluorocarbon.

(B74). The method of any one of (B67) to (B73), wherein the process gas further comprises a carbon component and a hydrogen component.

(B75). The method of (B74), wherein the process gas comprises at least one component selected from a group consisting of $H_2$, HF, $C_xH_y$, $CH_xF_y$, and $NH_3$ as a molecule containing the hydrogen component, where x and y are each natural number.

(B76). The method of any one of (B67) to (B75), wherein the process gas further comprises an oxygen component.

(B77). The method of any one of (B67) to (B75), wherein the process gas is free of oxygen.

(B78). The method of any one of (B67) to (B77), wherein Step C involves forming a recess and then forming a protective film on the side face of the recess.

(B79). The method of any one of (B67) to (B77), wherein Step C comprises:

C1) etching the silicon-containing films to form a recess; and

C2) forming a protective film on the side face of the recess, wherein

Substep C1 and Substep C2 are carried out independently from each other.

(B80). The method of (B78) or (B79), wherein the protective film contains phosphorus-oxygen bonds.

(B81). The method of (B80), wherein the protective film further contains phosphorus-silicon bonds.

(B82). The method of any one of (B67) to (B81), wherein Step C involves supplying a radio-frequency bias electric power of 2 kW or more to a bottom electrode in a substrate support supporting the substrate.

(B83). The method of (B82), wherein the electric power is 10 kW or more.

(B84). The method of any one of (B67) to (B83), wherein Step C involves applying a pulsed DC voltage with negative polarity to the bottom electrode in the substrate support supporting the substrate.

(B85). The method of any one of (B1) or (B84), wherein the silicon-containing film is a dielectric silicon-containing film.

(B86). The method of any one of (B1) to (B85), wherein the silicon-containing film comprises at least one film selected from a group consisting of a silicon oxide film, a silicon nitride film, and a silicon film.

(B87). The method of any one of (B1) to (B84), wherein the silicon-containing film comprises at least two different silicon-containing sublayers.

(B88). The method of (B87), wherein the at least two silicon-containing sublayers comprise a silicon oxide sublayer and a silicon nitride sublayer.

(B89). The method of (B87), wherein the at least two silicon-containing sublayers comprise silicon oxide sublayers and silicon nitride sublayers that are alternately disposed.

(B90). The method of (B87), wherein the at least two silicon-containing sublayers comprise a silicon oxide sublayer and an elemental silicon sublayer.

(B91). The method of (B87), wherein the at least two silicon-containing sublayers comprise silicon oxide sublayers and polysilicon sublayers that are alternately stacked.

(B92). The method of any one of (B1) to (B91), wherein the substrate further comprises a mask on the silicon-containing film.

(C1). A method of etching comprising:
A) providing a substrate comprising a silicon-containing film and a mask in a chamber of a plasma treatment system; and
B) generating plasma from a process gas in the chamber to etch the silicon-containing film, the process gas including a hydrogen fluoride gas component, a phosphorus gas component, and a carbon gas component.

(C2). The method of (C1), wherein among the flow rate of the hydrogen fluoride gas component, the flow rate of the phosphorus gas component, and the flow rate of the carbon gas component, the flow rate of the hydrogen fluoride gas component is largest.

(C3). The method of (C1), wherein
the process gas further includes a rare gas, and
among the flow rates of all the gases excluding the rare gas in the process gas, the flow rate of the hydrogen fluoride gas component is largest.

(C4). The method of any one of (C1) to (C3), wherein the temperature of a substrate support that supports the substrate is set to a temperature of 0° C. or less.

(C5). The method of (C4), wherein in Step (b), the temperature of a substrate support that supports the substrate is set to a temperature of −40° C. or less.

(C6). The method of any one of (C1) to (C5), wherein the phosphorous gas component contains a halogen component.

(C7). The method of (C6), wherein the halogen component is a halogen component other than fluorine component.

(C8). The method of any one of (C1) to (C7), wherein the proportion of the flow rate of the phosphorus gas component in the sum of the flow rate of the hydrogen fluoride gas component, the flow rate of the phosphorus gas component, and the flow rate of the carbon gas component is 2% or more.

(C9). The method of any one of (C1) to (C8), wherein the process gas further includes a fluorine-free halogen gas component.

(C10). The method of (C9), wherein the proportion of the flow rate of the halogen gas component in the sum of the flow rate of the hydrogen fluoride gas component, the flow rate of the phosphorus gas component, the flow rate of the carbon gas component, and the flow rate of the halogen gas component is above 0% and 10% or less.

(C11). The method of any one of (C1) to (C10), wherein the silicon-containing film comprises a silicon oxide film.

(C12). The method of (C11), wherein the silicon-containing film further comprises a silicon nitride film.

(C13). A process gas for plasma etching of a silicon oxide film, the process gas comprising a hydrogen fluoride gas component, a phosphorus gas component, and a carbon gas component.

(C14). The process gas of (C13), wherein among the flow rate of the hydrogen fluoride gas component, the flow rate of the phosphorus gas component, and the flow rate of the carbon gas component, the flow rate of the hydrogen fluoride gas component is largest.

(C15). The process gas of (C13), wherein
the process gas further comprises a rare gas, and
among the flow rates of all the gases excluding the rare gas in the process gas, the flow rate of the hydrogen fluoride gas component is largest.

(C16). The process gas of any one of (C13) to (C15), wherein the phosphorous gas component contains a halogen component.

(C17). The process gas of (C16), wherein the halogen component is a halogen component other than component.

(C18). The process gas of any one of (C13) to (C15), wherein the proportion of the flow rate of the phosphorus gas component in the sum of the flow rate of the hydrogen fluoride gas component, the flow rate of the phosphorus gas component, and the flow rate of the carbon gas component is 2% or more.

(C19). A plasma treatment system comprising:
a chamber;
a substrate support in the chamber,
a gas supply unit configured to supply a process gas including a hydrogen fluoride gas component, a phosphorus gas component, and a carbon gas component into the chamber;
a plasma generator configured to generate plasma from the process gas; and
a controller configured to control the gas supply unit to supply the process gas into the chamber to etch a silicon-containing film of a substrate supported by the substrate support, and to control the plasma generator to generate plasma from the process gas in the chamber.

(D1). A method of etching comprising:
A) providing a substrate comprising a silicon-containing film and a mask in a chamber of a plasma treatment system; and
B) generating plasma from a process gas in the chamber to etch the silicon-containing film, the process gas including a hydrogen fluoride gas component and a phosphorus gas component.

(D2). The method of (D1), wherein among the flow rate of the hydrogen fluoride gas component and the flow rate of the phosphorus gas component, the flow rate of the hydrogen fluoride gas component is largest.

(D3). The method of (D1), wherein
the process gas further includes a rare gas, and
among the flow rates of all the gases excluding the rare gas in the process gas, the flow rate of the hydrogen fluoride gas component is largest.

(D4). The method of any one of (D1) to (D3), wherein the temperature of a substrate support that supports the substrate is set to a temperature of 0° C. or less.

(D5). The method of (D4), wherein in Step (b), the temperature of a substrate support that supports the substrate is set to a temperature of −40° C. or less.

(D6). The method of any one of (D1) to (D5), wherein the phosphorous gas component contains a halogen component.

(D7). The method of (D6), wherein the halogen component is a halogen component other than fluorine component.

(D8). The method of any one of (D1) to (D7), wherein the proportion of the flow rate of the phosphorus gas component in the sum of the flow rate of the hydrogen fluoride gas component and the flow rate of the phosphorus gas component is 2% or more.

(D9). The method of any one of (D1) to (D8), wherein the process gas further includes a fluorine-free halogen gas component.

(D10). The method of (D9), wherein the proportion of the flow rate of the halogen gas component in the sum of the flow rate of the hydrogen fluoride gas component, the flow rate of the phosphorus gas component, and the flow rate of the halogen gas component is above 0% and 10% or less.

(D11). The method of any one of (D1) to (D10), wherein the silicon-containing film comprises a silicon oxide film.

(D12). The method of (D11), wherein the silicon-containing film further comprises a silicon nitride film.

(D13). A process gas for plasma etching of a silicon oxide film, the process gas comprising a hydrogen fluoride gas component and a phosphorus gas component.

(D14). The process gas of (D13), wherein among the flow rate of the hydrogen fluoride gas component and the flow rate of the phosphorus gas component, the flow rate of the hydrogen fluoride gas component is largest.

(D15). The process gas of (D13), wherein
the process gas further comprises a rare gas, and
among the flow rates of all the gases excluding the rare gas in the process gas, the flow rate of the hydrogen fluoride gas component is largest.

(D16). The process gas of any one of (D13) to (D15), wherein the phosphorous gas component contains a halogen component.

(D17). The process gas of (D16), wherein the halogen component is a halogen component other than component.

(D18). The process gas of any one of (D13) to (D15), wherein the proportion of the flow rate of the phosphorus gas component in the sum of the flow rate of the hydrogen fluoride gas component and the flow rate of the phosphorus gas component is 2% or more.

(D19). A plasma treatment system comprising:
a chamber;
a substrate support in the chamber,
a gas supply unit configured to supply a process gas including a hydrogen fluoride gas component, and a phosphorus gas component into the chamber;
a plasma generator configured to generate plasma from the process gas; and
a controller configured to control the gas supply unit to supply the process gas into the chamber to etch a silicon-containing film of a substrate supported by the substrate support, and to control the plasma generator to generate plasma from the process gas in the chamber.

It should be understood that the embodiments described above are provided for mere illustrative purposes and can be modified within the scope of the present disclosure. The embodiments disclosed herein should not be construed to limit of the scope of the disclosure and the scope of the disclosure should be determined based on the description of the attached claims.

The invention claimed is:

1. A plasma processing apparatus, comprising:
a chamber;
a substrate support to support a substrate in the chamber, the substrate including a silicon-containing film and a mask;
a first gas supply;
a second gas supply;
a plasma generator; and
a controller configured to
control the first gas supply to supply a hydrogen fluoride gas into the chamber,
control the second gas supply to supply a phosphorous gas into the chamber, and
control the plasma generator to generate a plasma from the hydrogen fluoride gas and the phosphorous gas in the chamber to etch the silicon-containing film of the substrate supported by the substrate support.

2. The plasma processing apparatus of claim 1, wherein the mask comprises a metal material including at least one selected from titanium nitride, tungsten, and tungsten carbide.

3. The plasma processing apparatus of claim 1, wherein phosphorus gas includes a phosphorous component selected from the group consisting of $PF_3$, $PCl_3$, $PF_5$, $PCl_5$, $POCl_3$, $PH_3$, $PBr_3$, and $PBr_5$.

4. The plasma processing apparatus of claim 1, wherein the phosphorus gas includes a fluorine component.

5. The plasma processing apparatus of claim 4, wherein the phosphorus gas includes $PF_3$ or $PF_5$.

6. The plasma processing apparatus of claim 1, further comprising:
a third gas supply, wherein
the controller is further configured to control the third gas supply to supply a halogen gas into the chamber, and
the plasma is generated from the hydrogen fluoride gas, the phosphorus gas and the halogen gas.

7. The plasma processing apparatus of claim 6, wherein the halogen gas is $Cl_2$ gas and/or HBr gas.

8. The plasma processing apparatus of claim 1, further comprising:
a bias source to provide a pulsed bias RF power to the substrate support.

9. The plasma processing apparatus of claim 8, wherein
each cycle of the pulsed bias RF power comprises a first period and a second period,
the pulsed bias RF power has a first power level during the first period, and a second power level during the second period,
the second power level is different from the first power level.

10. The plasma processing apparatus of claim 1, further comprising:
a bias source to apply a pulsed negative DC voltage to the substrate support.

11. The plasma processing apparatus of claim 10, wherein
each cycle of the pulsed negative DC voltage comprises a first period and a second period,
the pulsed negative DC voltage has a first voltage level during the first period, and a second voltage level during the second period,
the second voltage level is different from the first voltage level.

12. An etching method, comprising:
providing a substrate into a chamber, the substrate including a silicon-containing film and a mask;
supplying a hydrogen fluoride gas and a phosphorus gas into the chamber; and
generating a plasma from the hydrogen fluoride gas and the phosphorus gas in the chamber to etch the silicon-containing film of the substrate.

13. The etching method of claim 12, wherein the mask comprises a metal material including at least one selected from titanium nitride, tungsten, and tungsten carbide.

14. The etching method of claim 12, wherein phosphorus gas includes a phosphorous component selected from the group consisting of $PF_3$, $PCl_3$, $PF_5$, $PCl_5$, $POCl_3$, $PH_3$, $PBr_3$, and $PBr_5$.

15. The etching method of claim 12, wherein the phosphorus gas includes a fluorine component.

16. The etching method of claim 15, wherein the phosphorus gas includes $PF_3$ or $PF_5$.

17. The etching method of claim 12, further comprising:
supplying a halogen gas into the chamber,
wherein the plasma is generated from the hydrogen fluoride gas, the phosphorus gas and the halogen gas.

18. The etching method of claim 17, wherein the halogen gas is $Cl_2$ gas and/or HBr gas.

19. The etching method of claim 12, further comprising:
providing a pulsed bias RF power to a substrate support disposed in the chamber.

20. The etching method of claim 12, further comprising:
applying a pulsed negative DC voltage to a substrate support disposed in the chamber.

* * * * *

UNITED STATES PATENT AND TRADEMARK OFFICE
CERTIFICATE OF CORRECTION

| | | |
|---|---|---|
| PATENT NO. | : 12,142,484 B2 | Page 1 of 1 |
| APPLICATION NO. | : 18/113078 | |
| DATED | : November 12, 2024 | |
| INVENTOR(S) | : Takahiro Yokoyama et al. | |

It is certified that error appears in the above-identified patent and that said Letters Patent is hereby corrected as shown below:

On the Title Page

Item (30) Foreign Application Priority Data, the following should be added:
-- Feb. 14, 2020 (JP)............... PCT/JP2020/005847 --

Signed and Sealed this
Twenty-eighth Day of January, 2025

Coke Morgan Stewart
*Acting Director of the United States Patent and Trademark Office*